(12) United States Patent
Tsubaki et al.

(10) Patent No.: US 6,696,096 B2
(45) Date of Patent: Feb. 24, 2004

(54) APPARATUS FOR AND METHOD OF VACUUM VAPOR DEPOSITION AND ORGANIC ELECTROLUMINESCENT DEVICE

(75) Inventors: Kenji Tsubaki, Katano (JP); Junji Kido, 9-4-3, Umami-kita, Koryo-cho, Kitakatsuragi-gun, Nara (JP), 635-0831; Yasuhisa Kishigami, Toyonaka (JP); Yukihiro Kondo, Hirakata (JP)

(73) Assignees: Matsushita Electric Works, Ltd., Kadoma (JP); Junji Kido, Kitakatsuragi-gun (JP)

( * ) Notice: Subject to any disclaimer, the term of this patent is extended or adjusted under 35 U.S.C. 154(b) by 132 days.

(21) Appl. No.: 09/885,406

(22) Filed: Jun. 21, 2001

(65) Prior Publication Data

US 2002/0017245 A1 Feb. 14, 2002

(30) Foreign Application Priority Data

Jun. 22, 2000 (JP) ........................ 2000-187582

(51) Int. Cl.⁷ ................................. B05D 3/06
(52) U.S. Cl. ....................... 427/69; 427/66; 313/504
(58) Field of Search ..................... 313/504; 427/67, 427/69, 248.1, 250, 255.6, 255.5, 247; 156/610, 611

(56) References Cited

U.S. PATENT DOCUMENTS

| 4,543,275 A | 9/1985 | Akashi et al. |
| 4,607,152 A | 8/1986 | Allovon et al. |
| 4,769,292 A | 9/1988 | Tang et al. |
| 5,185,181 A | * 2/1993 | Mikami et al. ............... 427/69 |
| 5,505,985 A | * 4/1996 | Nakamura et al. ........... 427/66 |
| 5,677,546 A | * 10/1997 | Yu ............................ 257/40 |

FOREIGN PATENT DOCUMENTS

| EP | 0 337 369 | 10/1989 |
| EP | 0 967 667 | 12/1999 |
| EP | 0 976 847 | 2/2000 |
| GB | 1 529 418 | 10/1978 |
| JP | 60-100666 | 6/1985 |
| JP | 63-237516 | 10/1988 |
| JP | 1-259169 | 10/1989 |
| JP | 1-272767 | 10/1989 |
| JP | 1-287275 | 11/1989 |
| JP | 2-118073 | 5/1990 |
| JP | 2000-12218 | 1/2000 |
| JP | 2000-150394 | 5/2000 |

* cited by examiner

Primary Examiner—Alexander Gilman
(74) Attorney, Agent, or Firm—Oblon, Spivak, McClelland, Maier & Neustadt, P.C.

(57) ABSTRACT

A vacuum vapor deposition apparatus includes a vacuum chamber having a plurality of vapor sources and a heater for heating the vapor sources to achieve vacuum vapor deposition on a surface of at least one substrate within the vacuum chamber. At least one of the vapor sources utilizes an organic material. A hot wall, which encloses the vapor sources and a space in which the vapor sources and the substrate confront each other, is heated to a temperature at which the organic material is neither deposited nor decomposed. The organic material is vapor deposited on the surface of the substrate by heating the vapor sources while the vapor sources and the substrate are moved relative to each other.

24 Claims, 14 Drawing Sheets

APPARATUS FOR AND METHOD OF VACUUM VAPOR DEPOSITION AND ORGANIC ELECTROLUMINESCENT DEVICE

BACKGROUND OF THE INVENTION

1. Field of the Invention

The present invention relates to the art of vacuum vapor deposition of electroluminescent materials on a substrate to form an electroluminescent device. More specifically, the present invention relates to an apparatus and a method designed to accomplish the vacuum vapor deposition of the electroluminescent materials and also to an organic electroluminescent device resulting therefrom.

2. Description of the Related Art

To perform the vacuum vapor deposition, a vacuum deposition system is widely utilized, which generally includes a vacuum chamber having a vapor source and a substrate disposed in face-to-face relation with each other within the vacuum chamber. With this vacuum deposition system, after the vacuum chamber has been evacuated, the vapor source is heated to fuse and vaporize, or sublimated to vaporize, to thereby produce a gaseous phase of the vapor source which is subsequently deposited on one surface of the substrate to form a deposited film. For heating the vapor source, numerous methods have been employed such, for example, as electron beam radiation in which electrons are accelerated towards the vapor source to heat it, resistance heating in which an electric power is supplied to a resistance element constructed in the form of a boat made of a high melting point metal such as tungsten or molybdenum while the vapor source is placed on the boat, and so on. While vapor molecules emanating from the vapor source as the latter is heated are effused rectilinearly in a direction normal to the vapor source, the space into which the vapor molecules are effused is kept evacuated and, therefore, the vapor molecules will travel a mean free pass of a few tens of meters with the rectilinearly travelling vapor molecules subsequently deposited on a substrate that is disposed in face-to-face relation with the vapor source.

Since the vapor molecules are effused rectilinearly in a direction normal to the vapor source as discussed above, the vapor molecules travel rectilinearly in such a direction as to scatter in all directions as shown by arrows in FIG. 14. If the substrate shown by 3 has a flat surface, the distance d1 from the vapor source 2 to a center area of the substrate 3 differs from the distance d2 from the vapor source 2 to an end area of the substrate 3 and, therefore, the amount of deposition of the vaporized material on that center area of the substrate 3 and that on the end area of the substrate 3 differ from each other, resulting in a problem in that the thickness of a film formed on the substrate 3 tends to become uneven over the surface of the substrate 3.

Also, since the vapor molecules from the vapor source 2 travel rectilinearly in such a direction as to scatter in all directions, there is a substantial amount of the vapor molecules that do not travel towards the substrate 3 and so neither deposit on nor participate in formation of the film on the surface of the substrate 3, resulting in waste of the material. Accordingly, problems have been encountered in that the efficiency of utilization of the material used in the vapor source 2 is low, that is, the yield is low and in that the deposition rate at which the film is formed on the surface of the substrate 3 is also low.

Some of the vapor molecules that are not deposited on the substrate 3 are deposited on an inner wall surface of the vacuum chamber. If vacuum vapor deposition is carried out using the same vacuum chamber, but by changing the material from one over to another, vacuum vapor deposition of the different material would results in re-heating and, hence, re-vaporizing the material that has been previously deposited on the inner wall surface of the vacuum chamber, which would eventually be mixed in and, hence, contaminate the film being then vacuum vapor deposited, resulting in reduction in purity of the resulting film.

In addition, if the material is deposited on the inner wall surface of the vacuum chamber in the manner described above, such a problem has been arisen that release of the vacuum chamber to the atmosphere permits moisture and gaseous components of the outside air to be occluded in the deposited material to such an extent as to hamper maintenance of the vacuum chamber under vacuum. Also, there has been a possibility of such a problem occurring that occlusion of the atmospheric moisture and gaseous components in the deposited material results in eventual separation of the deposited material from the inner wall surface of the vacuum chamber in the form of finely divided flaky debris which would constitute a cause of contamination of the substrate and the crucible such as the boat.

Considering that an organic material such as an organic electroluminescent material requires a relatively low heating temperature to be used during vacuum vapor deposition, some of the vapor molecules that are not deposited on the substrate 3 are apt to be deposited on the inner wall surface of the vacuum chamber and, moreover, the vapor molecules deposited on the inner wall surface of the vacuum chamber are susceptible to evaporation. Accordingly, there is a high possibility of problems occurring that are associated with deposition of such some of the vapor molecules on the inner wall surface of the vacuum chamber.

An organic thin film element is generally formed by successively laminating and depositing organic thin films on a substrate so as to exhibit individual functions. When it comes to the organic electroluminescent (EL) device, the organic electroluminescent device generally represents a layered structure in which organic thin films are successively layered on a transparent electrode on the substrate. Such layered structure is fabricated by successively vacuum vapor depositing a plurality of organic materials. Since U.S. Pat. No. 4,769,292 issued Sep. 6, 1988 to Tang, et al. and assigned to Eastman Kodak Company has been published, a method of doping a small quantity of a fluorescent light emitting material into an organic host material during the vacuum vapor deposition is largely practiced. By way of example, for formation of a green color element, it is well known to dope quinacridone into the host material, which is used in the form of an Alq3 (tris-(8-hydroxyquinoline) aluminum) layer, by means of codeposition in which quinacridone is simultaneously vacuum vapor deposited. Also, in order to form a high efficiency organic EL device, it is also well known to codeposit a hole transporting organic material and an acceptor for enhancing the hole injecting efficiency from an anode and also to form an electron injected layer by codeposition of the electron transporting organic material and a donor such as Li.

In those film forming methods in which the organic materials are vacuum vapor deposited, it is a general practice to dispose two or more vapor sources within a single vacuum chamber to achieve the vacuum vapor deposition, but in performing such codeposition, the concentration of the dopant is an important factor that determines the nature of the resultant film. In other words, in the case of the organic materials, the temperature at which they evaporate is low and, even when a dual vapor deposition is carried out, it often occurs that the respective vaporizing temperatures of two vapor sources are close to each other. Where one of the organic materials is deposited on, for example, a wall of the vacuum chamber, reheating and consequent re-evaporation of the organic material deposited on the wall surface of the vacuum chamber will adversely affect the doping concentration within the eventually formed film. Accordingly, even in such case, there is a high possibility of occurrence of such problems associated with deposition of some of the vapor molecules, not deposited on the substrate, on the inner wall surface of the vacuum chamber.

SUMMARY OF THE INVENTION

The present invention has been developed to overcome the above-described disadvantages.

It is accordingly an objective of the present invention to provide a vacuum vapor deposition apparatus in which, when an organic material is to be vapor deposited, the organic material can be deposited at a high deposition rate to a uniform film thickness and at a high yield and in which vacuum vapor deposition can be performed at a high purity while minimizing deposition of a vaporized matter within a vacuum chamber and maintaining a high quality of vacuum within the vacuum chamber.

In accomplishing the above and other objectives, the present invention provides a vacuum vapor deposition apparatus which includes a vacuum chamber having a plurality of vapor sources and a heater for heating the vapor sources to achieve vacuum vapor deposition on a surface of at least one substrate within the vacuum chamber, wherein at least one of the vapor sources utilizes an organic material. A space in which the vapor sources and the substrate confront each other is enclosed by a hot wall, which is heated to a temperature at which the organic material will be neither deposited nor decomposed. The organic material is vapor deposited on the surface of the substrate by heating the vapor sources while the vapor sources and the substrate are moved relative to each other.

Preferably, the vapor deposition is effected on the surface of the substrate by heating the vapor sources while the vapor sources and the hot wall are moved relative to each other.

In order to accomplish the relative movement between the substrate and the vapor sources, the vacuum vapor deposition apparatus preferably includes a substrate transport device for moving the substrate relative to the vapor sources. This substrate transport device is capable of controlling a speed of movement of the substrate. Preferably, the substrate transport device may have a capability of causing the substrate to move along a circular path.

The substrate to be handled with the vacuum vapor deposition apparatus of the present invention may be a length of strip, which is transported from a supply roll towards a take-up roll.

In a preferred embodiment of the present invention, the vacuum chamber may have at least one auxiliary chamber fluid-connected therewith. This auxiliary chamber can be evacuated. In this design, one of the vapor sources is selectively loaded or unloaded between the vacuum chamber and the auxiliary chamber.

A top opening of the hot wall adjacent the substrate preferably has a width as measured in a direction perpendicular to a direction of movement of the substrate, which is within the range of a value 20% greater than a width of the substrate as measured in a direction perpendicular to the direction of movement of the substrate, to a value 20% smaller than the width of the substrate. Also, the hot wall preferably encloses 60 to 90% of the space in which the vapor sources and the substrate confront each other.

In another preferred embodiment, a surface of the hot wall confronting the space in which the vapor sources and the substrate confront each other is made of a material hard to react with the organic material.

The present invention also provides a method of vacuum vapor depositing a plurality of materials on a surface of at least one substrate by heating vapor sources within a vacuum chamber. This method includes: using an organic material for at least one of the vapor sources; heating a hot wall to a temperature at which the organic material will be neither deposited nor decomposed; heating the vapor sources while the vapor sources and the substrate, which confront each other, are enclosed by the hot wall; and moving the substrate and the vapor sources relative to each other. The organic material used as the vapor source may be an organic electroluminescent material.

The present invention furthermore provides an organic electroluminescent device formed by depositing a plurality of organic electroluminescent materials on a surface of a substrate by means of the vacuum vapor deposition method discussed above.

BRIEF DESCRIPTION OF THE DRAWINGS

The above and other objectives and features of the present invention will become more apparent from the following description of preferred embodiments thereof with reference to the accompanying drawings, throughout which like parts are designated by like reference numerals, and wherein.

DETAILED DESCRIPTION OF THE PREFERRED EMBODIMENTS

This application is based on an application No. 2000-187582 filed Jun. 22, 2000 in Japan, the content of which is herein expressly incorporated by reference in its entirety.

Figure 1:
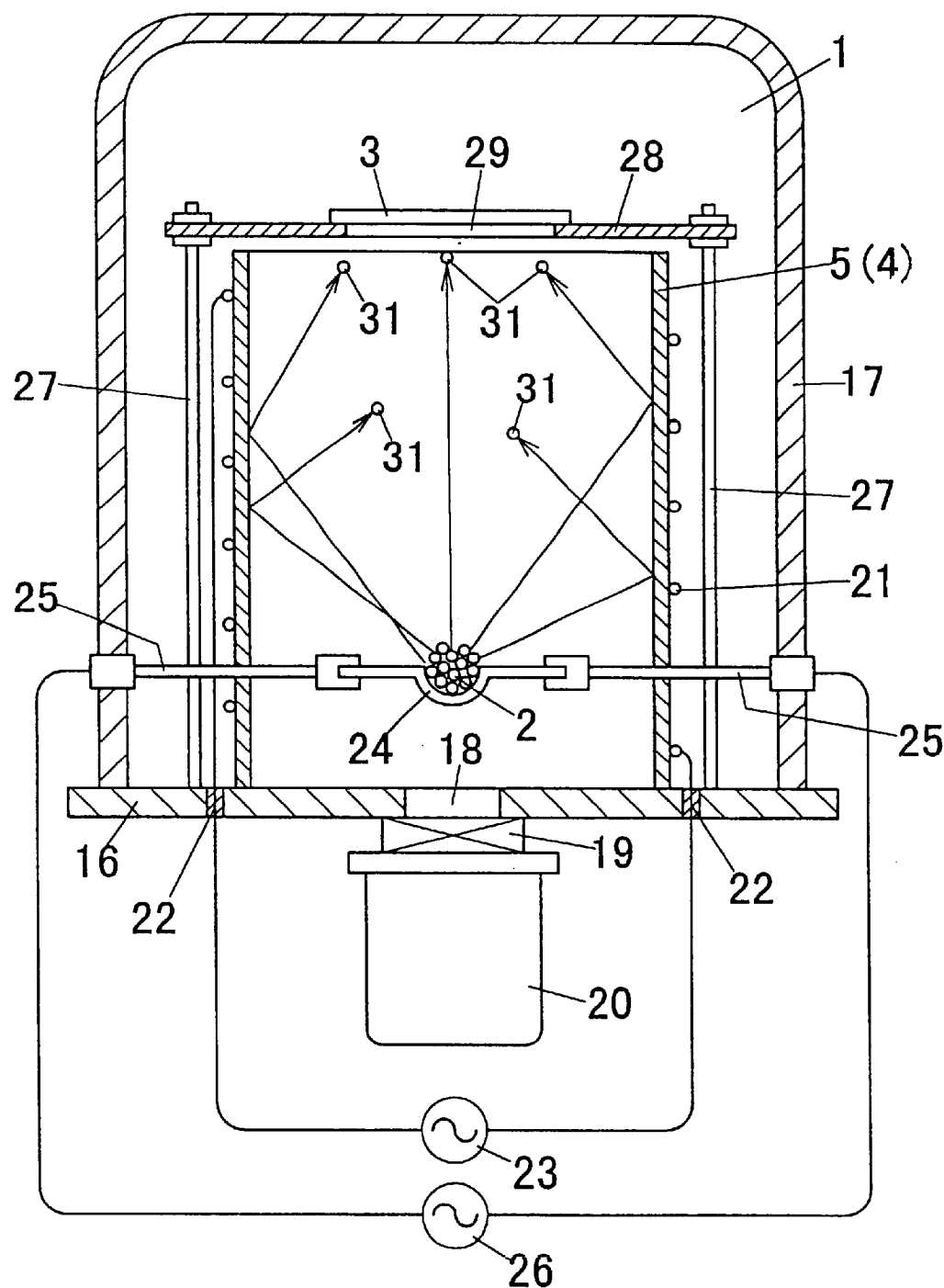
FIG. 1 is a schematic longitudinal sectional view of a vacuum vapor deposition apparatus according to a first embodiment of the present invention.

First Embodiment (FIG. 1)

Referring to FIG. 1 showing a vacuum vapor deposition apparatus according to a first embodiment of the present invention, a vacuum chamber 1 shown therein includes a support base 16 and a vacuum container 17 capped onto the support base 16. The support base 16 has a vent hole 18 defined therein, which is connected with a vacuum pump 20 through a gate valve 19, both positioned on one side of the support base 16 opposite to the vacuum container 17. In the illustrated embodiment, as a wall 4 surrounding a space in which a vapor source 2 and a substrate 3 confront each other, an open-ended hollow body 5 is employed and is mounted on the support base 16 and within the vacuum chamber 1. The wall 4 surrounding the space in which the vapor source 2 and the substrate 3 confront each other may not be always limited to the hollow body 5 of a cylindrical configuration, but may be defined by a tubular body of any suitable shape such as, for example, a polygonal shape or a conical shape and may also be comprised of a plurality of partition wall segments assembled together to represent a tubular shape. A sheathed heater 21 is spirally turned externally around the hollow body 5 and is electrically connected with an electric power source 23 through current introducing terminal members 22 secured to the support base 16 so that the sheathed heater 21 can be electrically energized to heat the hollow body 5.

A heating element 24 in the form of a boat made of a metal having a high melting point is disposed in a lower region of and within the hollow body 5. Opposite ends of the heating element 24 are connected electrically with respective current introducing terminal members 25 that extend inwardly through the vacuum container 17 and then through the hollow body 5 so as to terminate in the vicinity of the heating element 24. The current introducing terminal members 25 are in turn electrically connected with an electric power source 26 so that the heating element 24 can be resistance heated by an electric power supplied from the electric power source 26. A plurality of support rods 27 are positioned outside the hollow body 5 and erected on the support base 16 so as to extend upwardly at right angles to the support base 16 with a substrate support 28 mounted atop the support rods 27. The substrate support 28 is secured to respective top ends of the support rods 27 so as to assume a horizontal position, and a center portion of the substrate support 28 disposed above the top opening of the hollow body 5 and aligned with the heating element 24 within the hollow body 5 is perforated to define a deposition window 29.

So far as the illustrated embodiment is concerned, only the heating element 24 is disposed at the lower region within the hollow body 5 so that only one vapor source 2 can be heated to evaporate. However, a plurality of heating elements 24 may be disposed at the lower region within the hollow body 5 so as to receive different vapor sources 2 so that the different vapor sources 2 can be heated one at a time to accomplish codeposition of those vapor sources 2 on a single substrate.

Where in the practice of the present invention the plural vapor sources 2 are employed, at least one of the vapor sources 2 employs an organic material. This organic material may be an organic electroluminescent material (hereinafter, referred to as "organic EL material"), examples of which include tris-(8-hydroxyquinoline) aluminum complex, quinacridone, rubrene, N,N'-bis(3-methylphenyl)-(1,1'-biphenyl)4,4'-diamine (TPD), 4,4'-bis[N-(naphthyl)-N-phenyl-amino]biphenyl (α-NPD), bathophenanthroline, bathocuproine, and oxadiazole. When the EL is to be vapor deposited, it may occur that other than the organic EL material a metal may be used in part. Accordingly, one or some of the plural vapor sources 2 may use materials such as metals other than the organic materials and they may be vapor deposited simultaneously with vapor deposition of the organic materials. As materials other than the organic materials, lithium, cesium, lithium fluoride and an alloy containing at least one of them can be employed. Also, the substrate 3 having a surface on which the organic EL material and other materials are to be deposited may be a plate made of glass, metal or a synthetic resin and is not therefore limited to a particular material.

It is, however, to be noted that the vacuum vapor deposition apparatus according to the present invention is not always limited to the type in which the above-discussed organic EL material is employed as the vapor source 2, but can work satisfactorily even if the vapor source 2 is employed in the form of an organic material of a kind used in, for example, a photoelectric converting layer in a solar cell. The organic materials used to form the photoelectric converting layer include, for example, perylene derivatives, phthalocyanine derivatives, quinacridone derivatives and the like.

When in use, the vapor source 2 is placed on the heating element 24 which is in turn set in position at a lower center region of the hollow body 5, and the substrate 3 is placed on the substrate support 28 with a lower surface thereof exposed downwardly through the deposition window 29. In this way, the substrate 3 and the vapor source 2 are arranged in opposition to each other. The vacuum pump 20 is subsequently activated to evacuate the vacuum chamber 1 to a vacuum condition, and the heating element 24 is then electrically energized to heat the vapor source 2 and, on the other hand, the sheathed heater 21 is electrically energized to heat the hollow body 5. When the vapor source 2 is thus heated while the vacuum chamber 1 has been evaluated, the vapor source 2 melts and evaporates, or sublimates, to produce vapor. Vapor molecules 31 so produced from the vapor source 2 are rectilinearly effused from the vapor source 2 in the normal direction and then travel rectilinearly in various directions.

As discussed previously, some of the vapor molecules 3 travel rectilinearly towards the substrate 3 and the remaining portion of the vapor molecules 3 travel rectilinearly in directions diverting from the substrate 3. However, since a space between the vapor source 2 and the substrate 3, within which the vapor molecules 31 travel, is encircled by the hollow body 5 with the vapor molecules 3 consequently confined within the hollow body 5, the remaining portion of the vapor molecules 31 tending to travel respective directions diverting from the substrate 3, without being scattered astray, travel towards the substrate 3 after having been reflected by an inner wall surface of the hollow body 5 and, therefore, a major quantity of the vapor molecules 31 generated from the vapor source 2 can be caused to arrive at and be deposited on the surface of the substrate 3 to thereby participate in formation of a film.

Consequently, waste of the material can be minimized, the efficiency of utilization of the material of the vapor source 2 can be increased to achieve the vapor deposition with a high yield, and the rate at which the film is formed on the surface of the substrate 3 can be increased. Since the vapor molecules 31 which have been reflected from the inner wall surface of the hollow body 5 are deposited on various areas of the surface of the substrate 3 from various directions, the amount of deposition on such various areas of the surface of the substrate 3 can be made uniform, making it possible to form the film of an uniform film thickness.

Also, since the hollow body 5 so heated defines a hot wall, there is no possibility that even though the vapor molecules 31 are deposited on the surface of the hollow body 5, the deposited matter can be re-heated by the hollow body 5 to evaporate without being deposited on the surface of the hollow body 5. Thus, it is possible to avoid a deposition of the material of the vapor source 2 on the surface of the hollow body 5 and, since the vapor molecules 31 emanating from the vapor source 2 are confined by and within the hollow body 5, it is possible to minimize deposition on the inner wall surface of the vacuum chamber 1. Accordingly, where vacuum vapor deposition is to be performed using different materials with the use of the same vacuum chamber 1, even when the different materials are sequentially heated one after another during the vacuum vapor deposition, the surface of the vacuum chamber 1 is free from (or if existing at all, bears a small quantity of) deposited materials of a kind which would be again vaporized upon heating. Therefore, a vapor deposited film formed by the vacuum vapor deposition will not be contaminated, making it possible to form a film of a high purity. Also, since any deposited material which occludes the moisture and gaseous components contained in the air does not exist on the surface of the hollow body 5 and that of the vacuum chamber 1 (or if existing at all, exists in a small quantity), the difficulty encountered in maintaining the vacuum chamber 1 under vacuum can be eliminated.

Where the organic material such as the organic EL material is used as the vapor source 2 such as in the case of the present invention, since the temperature at which the organic material vaporizes is low, some of the vapor molecules 31 not deposited on the substrate 3 are apt to be deposited on the hollow body 5. However, heating of the hollow body 5 in the manner described above is effective to avoid such deposition. Also, while the organic EL film formed on the substrate 3 is a thin film having a thickness of a few hundreds nanometer and the purity of the film is severely required, the present invention is particularly effective in vapor depositing the organic EL material since the film of high purity can be formed as hereinabove described.

When it comes to heating of the hollow body 5 to a temperature at which the material of the vapor source 2 will not be deposited, the heating temperature to which the hollow body 5 is heated is preferably of a value equal to or higher than the temperature (evaporation or sublimation temperature) at which the vapor source 2 is vaporized under a reduced pressure employed for vacuum vapor deposition. Although the upper limit in the temperature of the hollow body 5 may not be particularly limited, it is essential that the material of the vapor source 2 is not decomposed at the heating temperature and, therefore, it is generally recommended that the heating temperature of the hollow body 5 has an upper limit which is equal to the temperature, at which the organic EL material forming the vapor source 2 is vaporized, plus about 100° C. Since the temperature of vaporization of such organic EL material is in the range of about 50 to 300° C., the heating temperature of the hollow body 5 is generally set to a value in the range of about 100 to 400° C. It is to be noted that although in the embodiment shown in FIG. 1 the heating source for the hollow body 5 is employed in the form of the sheathed heater 21 fixedly turned around the hollow body 5, radiant heat from, for example, a halogen lamp may be employed.

While the pressure to which the vacuum chamber 1 is evacuated may be suitably chosen, it must be of a value sufficient to allow the vapor molecules 31 emanating from the vapor source 2 to reach the substrate 3 without colliding against gaseous molecules present within the vacuum chamber 1, that is, to allow the vapor molecules 31 to travel a mean free pass of a few tens of centimeters, and is thus chosen to be of a value equal to or lower than 0.01 Pa. The lower the pressure inside the vacuum chamber 1, the better, and ideally 0 Pa. In the embodiment shown in FIG. 1, the top opening of the hollow body 5 adjacent the substrate 3 is formed to have a width within the range of a width that is 10% larger than the width of the substrate 3 to a width that is 10% smaller than the width of the substrate 3.

Figure 2A:
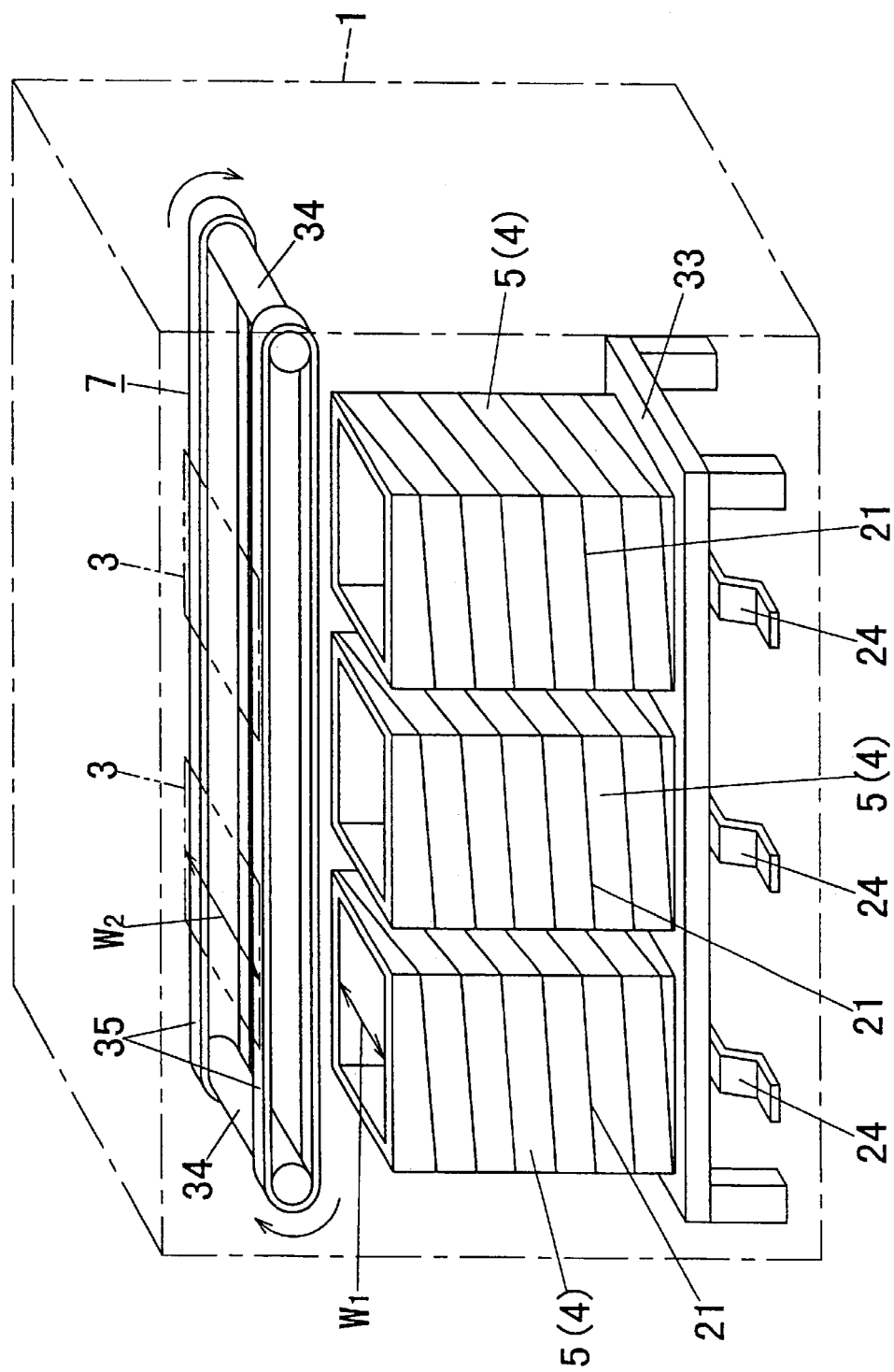
FIG. 2A is a schematic perspective view of the vacuum vapor deposition apparatus according to a second embodiment of the present invention.
Figure 2B:
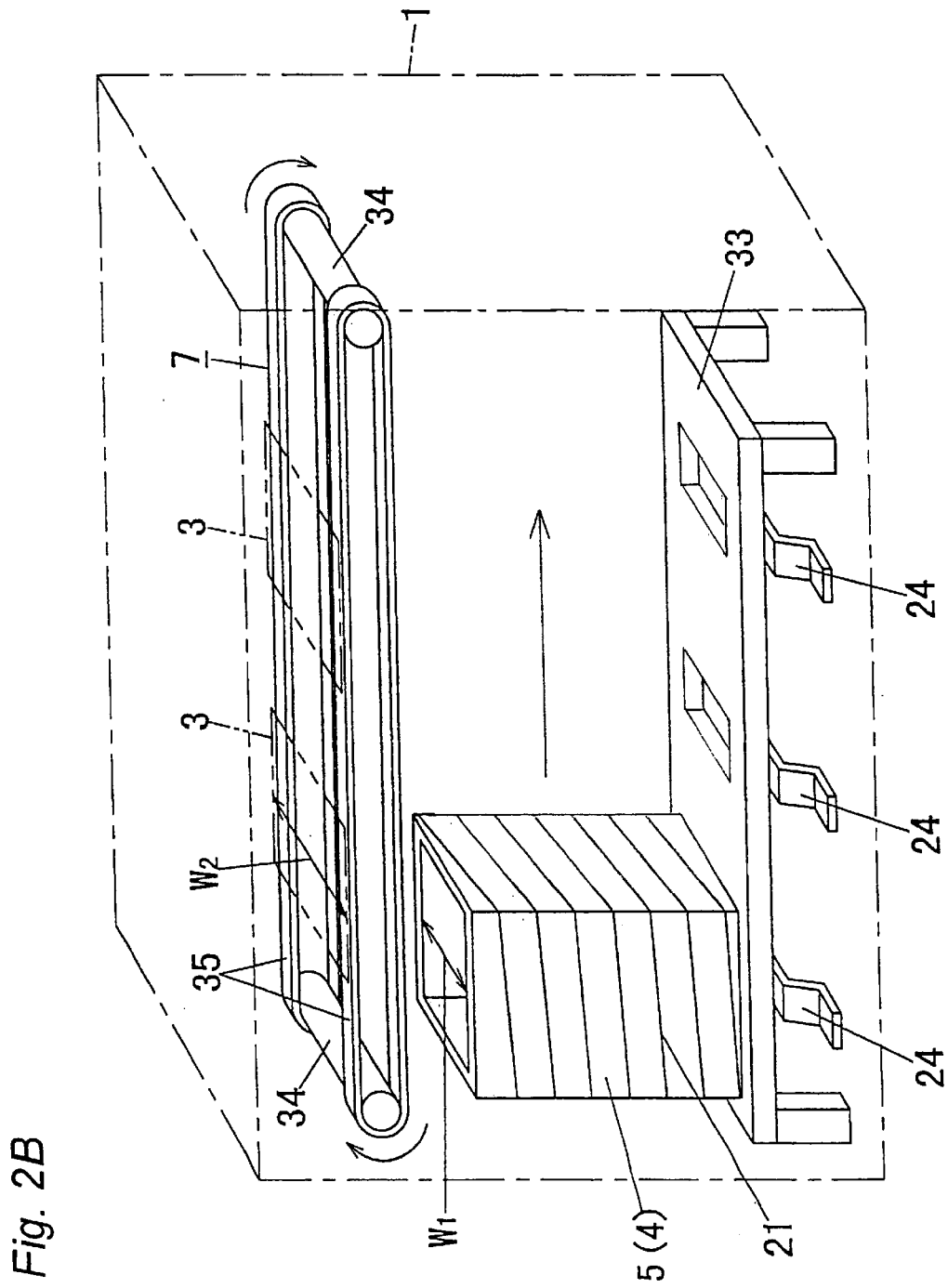
FIG. 2B is a view similar to FIG. 2A, but depicting a modification thereof.

Second Embodiment (FIGS. 2A and 2B)

Referring to FIG. 2 showing a second embodiment of the present invention, the vacuum chamber 1 accommodates therein a row of a plurality of (for example, three) hollow bodies 5 of a square-sectioned configuration. These hollow bodies 5 are mounted on a generally rectangular support base 33 in a row and are adapted to be heated by respective sheathed heaters 21 that are spirally turned externally therearound. A heating element 24 is disposed in a lower region of each of the hollow bodies 5 for receiving therein a respective vapor source 2 to be vaporized. Positioned immediately above respective top openings of the hollow bodies 5 is a substrate transport device 7 which includes a pair of endless conveyors 35 and 35 such as endless belts trained around and between spaced apart common drive and driven rolls 34 and 34. Thus, it will be seen that when the drive roll 34 is driven, the endless belts 35 and 35 can travel in one direction in unison with each other to transport the substrate 3, placed on respective upper runs of the endless belts 35 and 35 in a fashion straddling between the belt upper runs, to be continuously transported so as to move successively over the respective top openings of the hollow bodies 5.

In the vapor deposition apparatus according to the embodiment shown in FIG. 2A, when after the vacuum chamber 1 has been evacuated the vapor sources 2 each within the lower region of the corresponding hollow body 5 are heated by electrically energizing the associated heating elements 24 while the hollow bodies 5 are heated by the associated sheathed heaters 21, vapor molecules 31 are generated from the vapor source 2 within each of the hollow bodies 5. As the substrate 3 carried by the substrate transport device 7 moves successively past respective deposit positions immediately above the top openings of those hollow bodies 5, the vapor molecules 31 generated within the hollow bodies 5 are deposited on an undersurface of the substrate 3 with films of the different materials consequently formed on the undersurface of the substrate 3 in a layered fashion one above the other.

By causing the substrate transport device 7 to transport the substrate 3 so as to move successively past respective positions immediately above the top openings of the hollow bodies 5, it is possible for a series of vapor deposition to be performed continuously, not on a batch basis, with respect to a single substrate. Also, since a vacuum vapor deposited film can be formed by depositing the vapor molecules 31 on the undersurface of the substrate 3 as the substrate 3 being transported by the substrate transport device 7 move sequentially past the positions immediately above the top openings of the hollow bodies 5, the film of a uniform thickness can be formed by depositing the vapor molecules 31 uniformly on the undersurface of the substrate 3. Yet, since the substrate 3 as it moves over each of the top openings of the hollow bodies 5 is subjected to vacuum vapor deposition, the use of different materials for the respective vapor sources 2 placed inside the associated hollow bodies 5 facilitates formation of the film of a layered structure including layers made of the respective materials. Although in order for the organic EL material deposited on the substrate 3 to have a capability of emitting light, the film so formed on the substrate 3 is of the layered structure, the present invention is particularly effective in vacuum vapor depositing the organic EL material since the vapor deposition can result in the layered structure as described hereinabove.

Considering that the substrate transport device 7 is so controlled that the transport speed at which the endless belts 35 and 35 travel to transport the substrate 3 can be adjusted to an arbitrarily chosen speed, the speed at which the substrate 3 moves can be adjusted as desired. Since the thickness of the film deposited on the substrate 3 depends on the length of time over which the substrate 3 confronts the top opening of each of the hollow bodies 5, it is possible to control the thickness of the film to be formed on the substrate if the transport speed of the substrate 3 is adjusted to adjust the length of time required for the substrate 3 to pass over each of the hollow body 5.

In the embodiment shown in FIG. 2A, the width W1 of each of the top openings of the hollow bodies 5 as measured in a direction perpendicular to the direction of transport of the substrate 3 is so chosen as to be within the range of a value that is 20% greater than the width W2 of the substrate 3 as measured in a direction perpendicular to the direction of transport of the substrate 3, to a value that is 20% smaller than the width W2. If the width W1 of the top opening of each of the hollows 5 is greater than this range, the amount of vapor molecules 31 which would scatter outwardly through a space between the top opening of the respective hollow body 5 and the substrate 3 will increase, resulting in reduction of the yield. Conversely, if the width W1 of the top opening of each of the hollows 5 is smaller than this range, the amount of vapor molecule 31 travelling towards lateral end portions of the substrate 3 will decrease to such an extent that the thickness of portions of the resultant film corresponding to the lateral end portions of the substrate may decrease, resulting in difficulty in securing the film of a uniform thickness.

In describing the second embodiment of the present invention, it has been shown and described as the substrate 3 being transported successively past the respective positions immediately above the top openings of the hollow bodies 5. However, in a broad aspect of this embodiment, only one hollow body 5, rather than the plural hollow bodies 5, would be sufficient if the one hollow body 5 is supported for movement successively past the vapor sources 2 in unison with transportation of the substrate 3. In other words, in the embodiment shown in FIG. 2A, the number of the hollow bodies 5 may not be limited to two or more, and only one hollow body 5 may be employed satisfactorily if the single hollow body 5 is supported for movement in a direction conforming to the row of the vapor sources 2 in unison with movement of the substrate 3 transported by the endless belts 35 and 35, as shown in FIG. 2B.

EXAMPLE

Films of different materials were formed on the undersurface of the substrate 3 using the vapor deposition apparatus shown in FIG. 2A under the following conditions.

Size of Hot Wall: 50 mmL×50 mmW×250 mmH

Material of Hot Wall: stainless steel (SUS316)

Size of Substrate: 50 mmL×50 mmW×0.7 mmT

Material of Substrate: glass

Vapor Source: tungsten filament+crucible
   Vapor Source 1: CuPc (copper phthalocyanine)
      250° C. (Hot Wall Temp.)
   Vapor Source 2: α-NPD (α-napthylphenylbiphenyldiamine)
      250° C. (Hot Wall Temp.)
   Vapor Source 3: Alq3 (tris-(8-hydroxyquinoline) aluminum)
      250° C. (Hot Wall Temp.)

Electric Current: 5A for each vapor source

Speed of Travel of Substrate: 2 mm/sec

COMPARATIVE EXAMPLE

No hot wall was used.

Other conditions were the same as above.

EVALUATION

The film thickness was measured using a finger-type thickness meter.

→ Rate of Deposition (Tact Time)

A change in substrate weight and a change in crucible weight were measured before and after the deposition.
   Change in substrate weight/change in crucible weight×100→Efficiency of Utilization of Material

RESULTS

Present Invention
   Total Film Thickness=1300 Å (average rate of deposition=17.3 Å/sec)
   Efficiency of Utilization of Material=35.0%

Figure 3:
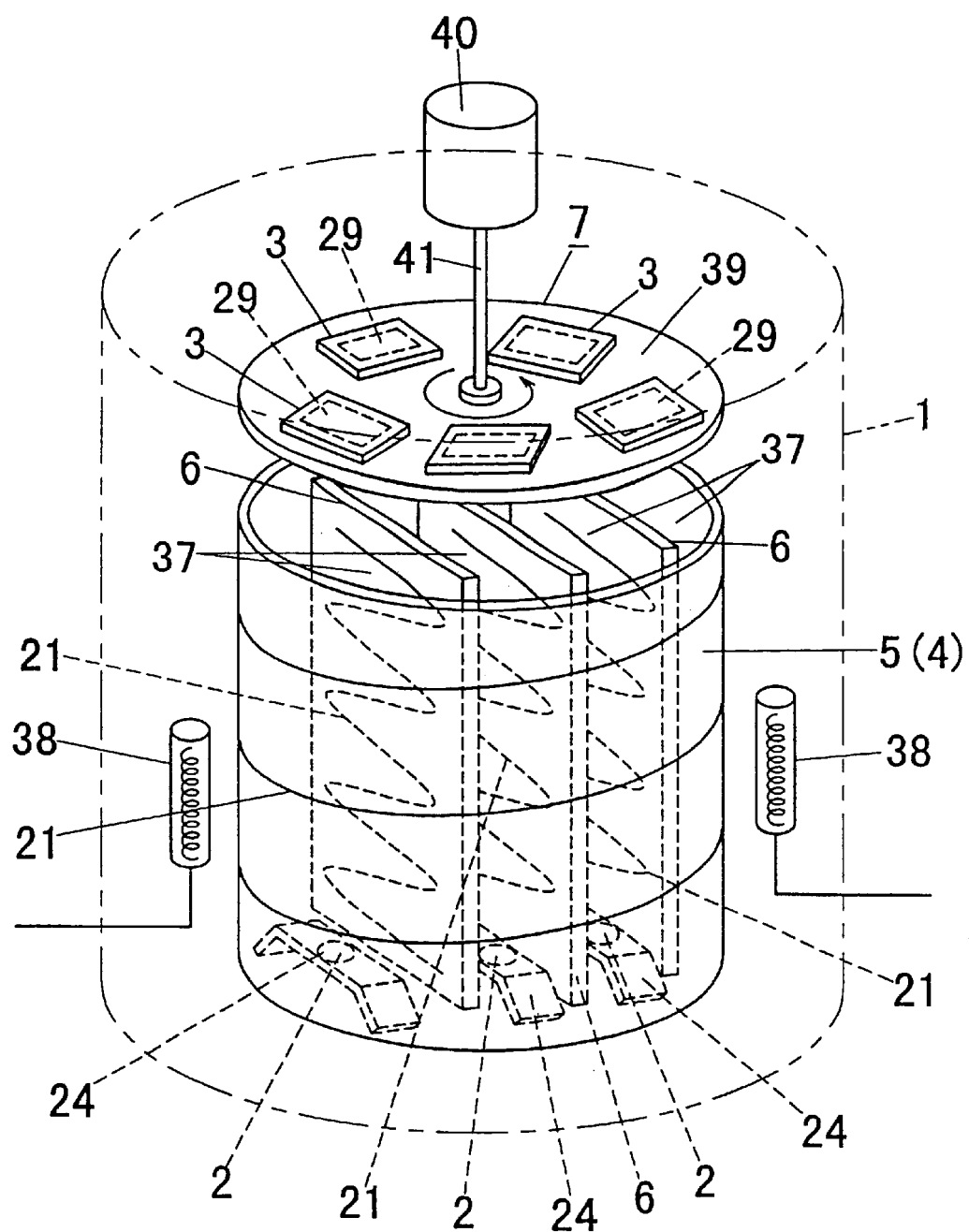
FIG. 3 is a schematic perspective view of the vacuum vapor deposition apparatus according to a third embodiment of the present invention.
Figure 4A:
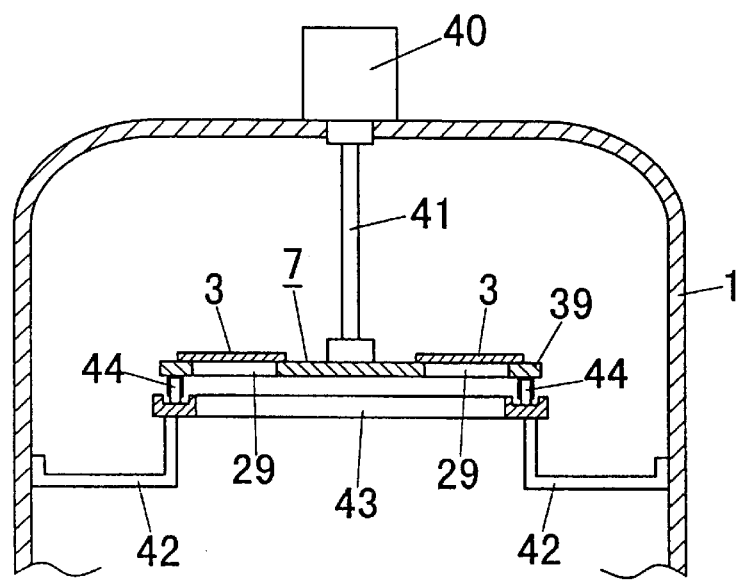
FIG. 4A is a schematic longitudinal sectional view of a portion of the vacuum vapor deposition apparatus according to the third embodiment of the present invention.
Figure 4B:
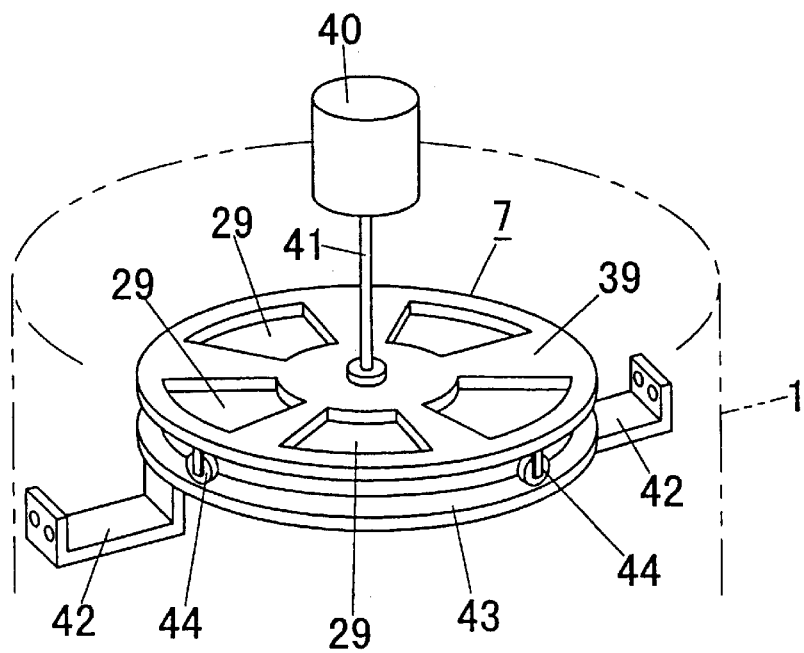
FIG. 4B is a schematic perspective view of that portion of the vacuum vapor deposition apparatus shown in FIG. 4A.

Comparative Example
   Total Film Thickness=140 Å (average rate of deposition=1.9 Å/sec)
   Efficiency of Utilization of Material=4.2% Third Embodiment (FIGS. 3, 4A and 4B)

A third embodiment of the present invention is shown in FIGS. 3, 4A and 4B. In this embodiment, the vacuum chamber 1 accommodates therein an open-ended hollow body 5 of a cylindrical configuration. This hollow body 5 has a plurality of (for example, three) partition walls 6 installed therein to define a corresponding number of longitudinally extending parallel chambers 37, each opening upwardly and downwardly from the top and bottom openings of the hollow body 5, respectively. Within the hollow body 5, each of the partition walls 6 has a sheathed heater 21 fixedly mounted thereon and capable of heating the respective partition wall 6 to a temperature equal to that of the hollow body 5. Each of the chambers 37 partitioned by the partition walls 6 has a respective vapor source 2 filled in the heating element 24 and positioned at a lower region thereof. Accordingly, the vacuum vapor deposition apparatus according to the illustrated embodiment is capable of accommodating the vapor sources 2 equal in number to the partitioned chambers 37 within the hollow body 5, with a space between each vapor source 2 and a substrate 3 being confined within the corresponding partitioned chamber 37 in the hollow body 5. The sheathed heater 21 is also spirally wound externally around the hollow body 5 to heat the latter and/or halogen lamps 38 are positioned within the vacuum chamber I to provide a heat source with which the hollow body 5 can be heated.

A substrate transport device 7 is disposed within the vacuum chamber 1 and positioned immediately above the top opening of the hollow body 5. The substrate transport device 7 used in this embodiment includes a horizontally lying carrier disc 39 and a drive motor 40 positioned externally of the vacuum chamber 1 and drivingly coupled with the carrier disc 39 through an output shaft 41 for rotating the carrier disc 39 about a geometric center thereof in a horizontal plane. The carrier disc 39 has a plurality of deposition windows 29 defined therein in a circular row concentric with the axis of rotation of the carrier disc 39. Substrates 3 are adapted to be mounted on the carrier disc 39 so as to align with the corresponding deposition windows 29.

FIGS. 4A and 4B illustrate a retainer mechanism for rotatably supporting the carrier disc 39. This retainer mechanism includes a guide ring rail 43 fixedly supported within the vacuum chamber 1 and immediately above the top opening of the hollow body 5, and a plurality of (for example, two) connecting arms 42 each fixed at one end to the ring rail 43 and at the opposite end to the inner wall surface of the vacuum chamber 1. The carrier disc 39 is rotatably mounted on the ring rail 43 by means of a circular row of casters or any suitable rollers 44 carried by the carrier disc 39 so as to travel along and above the ring rail 43.

According to the third embodiment shown in FIGS. 3, 4A and 4B, when after the vacuum chamber 1 has been evacuated the vapor sources 2 each within the lower region of the corresponding hollow body 5 are heated by electrically energizing the associated heating elements 24 while the hollow body 5 and the partition walls 6 are heated by the associated sheathed heaters 21, vapor molecules 31 are generated from the vapor source 2 within each of the partition chambers 37 inside the vacuum chamber 1. On the other hand, the substrates 3 revolve successively past respective deposit positions immediately above the partitioned chambers 37 as the carrier disc 39 of the substrate transport device 7 is driven about the output shaft 41. Accordingly, as the substrates 3 carried by the carrier disc 39 move successively past the respective deposit positions immediately above the partitioned chambers 37, the vapor molecules 31 generated within the partition chambers 37 are deposited on the undersurfaces of the substrates 3 to thereby form the deposited films.

Thus, by causing each substrate 3 to move past a top opening of each of the partitioned chambers 37, it is possible to deposit the vapor molecules 31 on the respective substrate 3 to form the deposited film on the respective substrate 3 and, accordingly, it is possible to form the deposited film of a uniform thickness. Also, since the vapor deposited film can be formed by depositing the vapor molecules 31 on the undersurface of each of the substrates 3 as the substrates 3 being transported by the substrate transport device 7 move sequentially past the positions immediately above the top openings of the partition chambers 37, the use of different materials for the respective vapor sources 2 placed inside the associated partition chambers 37 facilitates formation of the film of a layered structure including layers made of the respective materials.

The third embodiment shown in FIGS. 3, 4A and 4B does not require a plurality of hollow bodies 5 such as required in the previously described embodiment of FIG. 2A and, yet, is possible to form the deposited film of the layered structure using the different materials. Therefore, the apparatus can be simplified.

Figure 5:
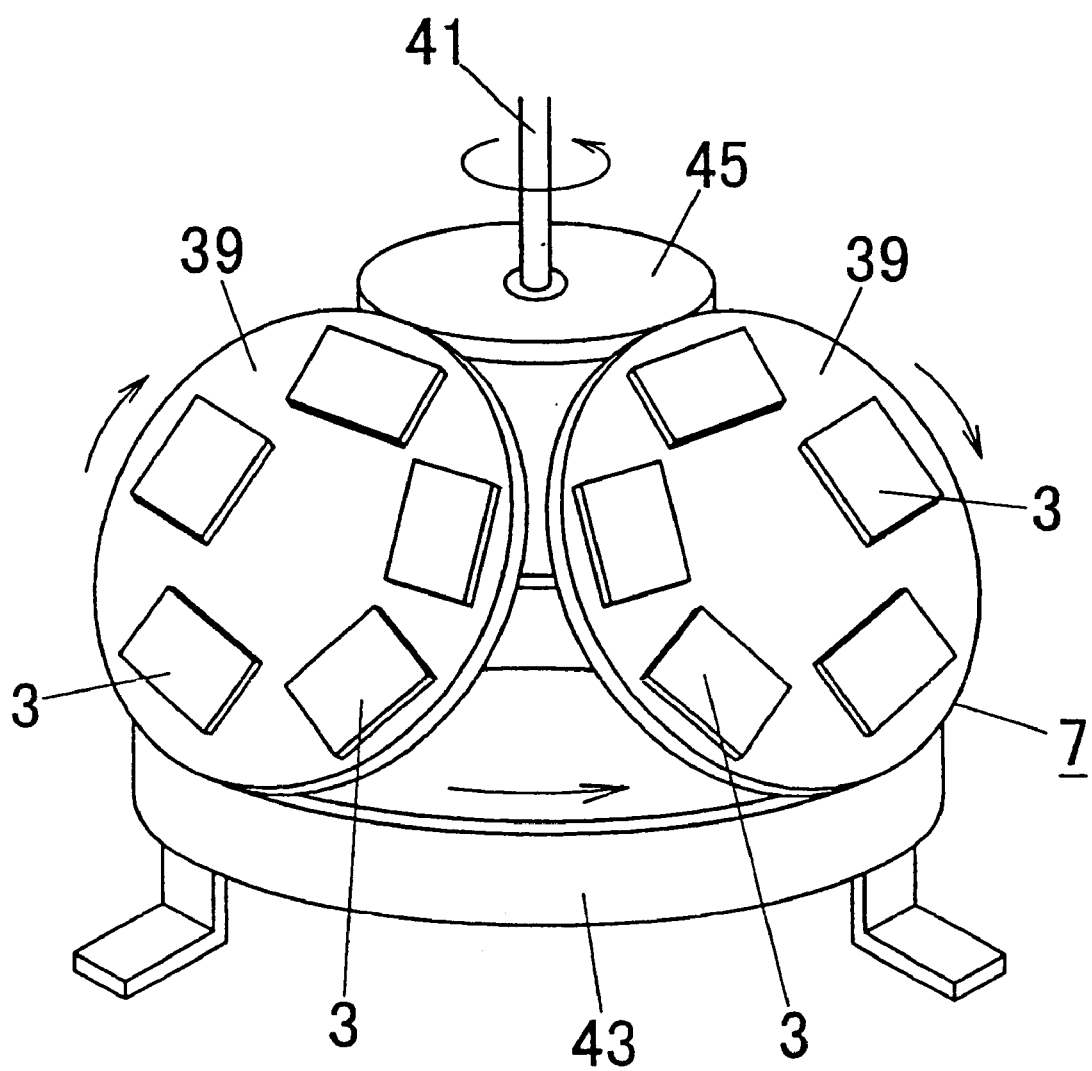
FIG. 5 is a perspective view of a portion of the vacuum vapor deposition apparatus according to a fourth embodiment of the present invention.

Fourth Embodiment (FIG. 5)

This embodiment shown in FIG. 5 is directed to the substrate transport device 7 that is designed to revolve the substrates 3 above the hollow body 5. The substrate transport device 7 shown therein includes, in addition to the ring rail 43, a plurality of (for example, three) carrier discs 39 rollingly resting on the ring rail 43, and a drive disc 45 drivingly coupled with the drive motor (not shown, but shown in FIGS. 4A and 4B) by means of the output shaft 41. Each of the carrier discs 39 resting on the ring rail 43 at a portion of the outer periphery thereof have an opposite portion of the outer periphery thereof held in frictional contact with an outer periphery of the drive disc 45 so that rotation of the drive disc 45 can result in rotation of the respective carrier disc 39 about its own geometric center. Thus, it is clear that rotation of each of the carrier discs 39 so effected in turn results in circular motion of the respective carrier disc 39 along the ring rail 43 about an axis coaxial with the drive shaft 41.

Figure 6:
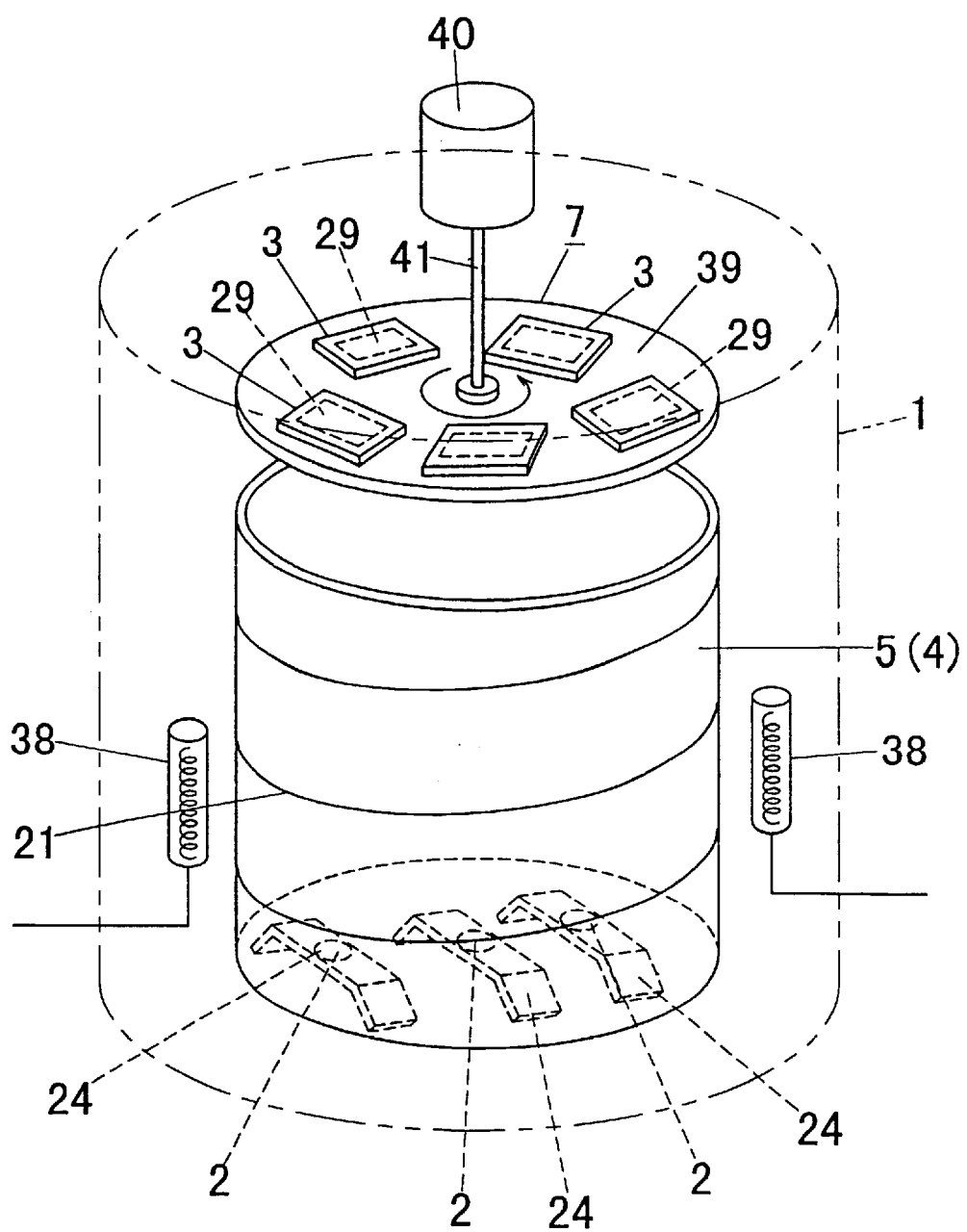
FIG. 6 is a perspective view of the vacuum vapor deposition apparatus according to a fifth embodiment of the present invention.

Fifth Embodiment (FIG. 6)

The vacuum vapor deposition apparatus according to a fifth embodiment of the present invention shown in FIG. 6 is substantially similar to that described in connection with the third embodiment shown in FIGS. 3, 4A and 4B. However, in this embodiment shown in FIG. 6, the use of the partition walls such as identified by 6 in FIG. 3 has been eliminated so that vapor molecules emanating from the different materials on the respective heating elements 24 can be deposited simultaneously on each of the substrates 3 in a mixed fashion.

Figure 7:
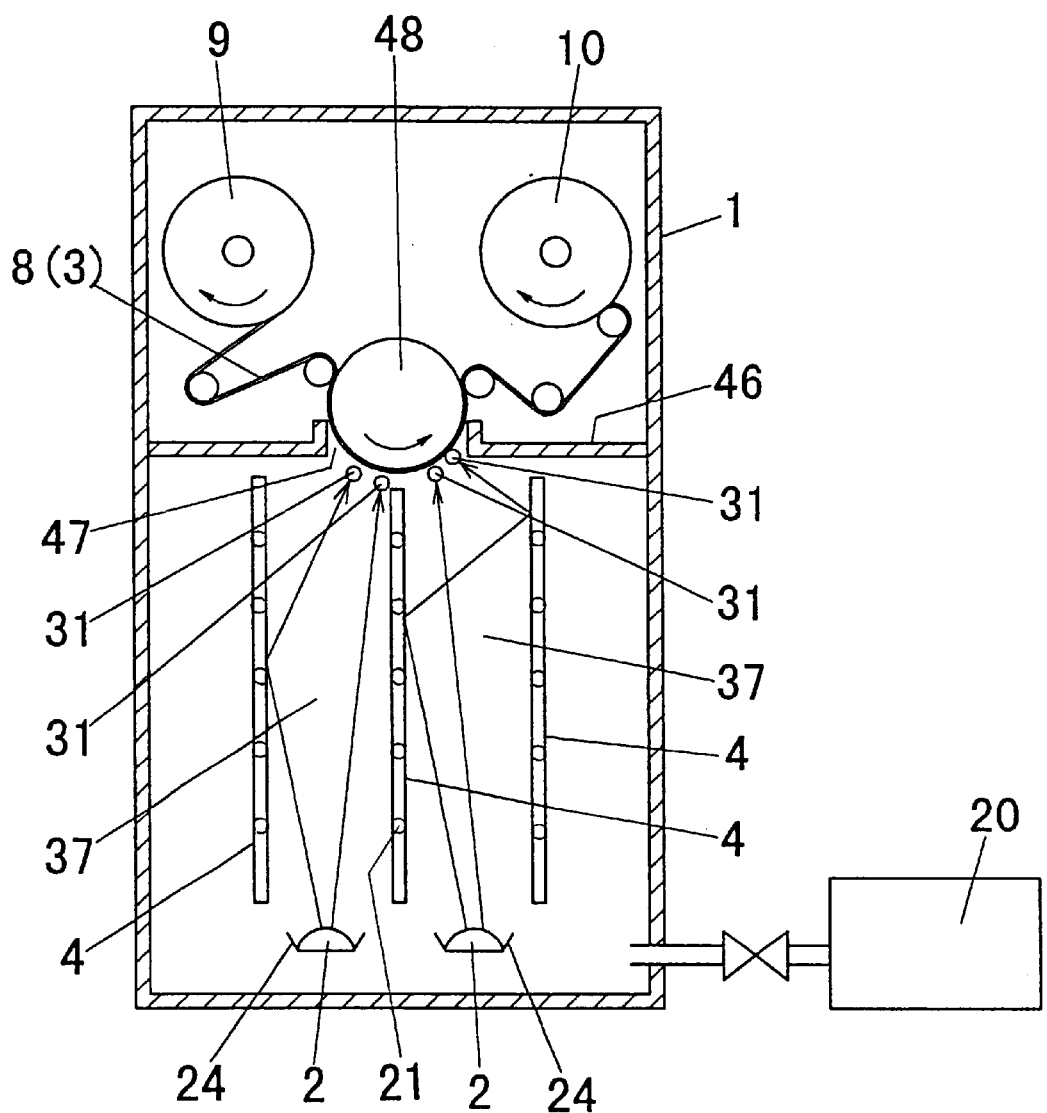
FIG. 7 is a schematic longitudinal sectional view of the vacuum vapor deposition apparatus according to a sixth embodiment of the present invention.
Figure 8:
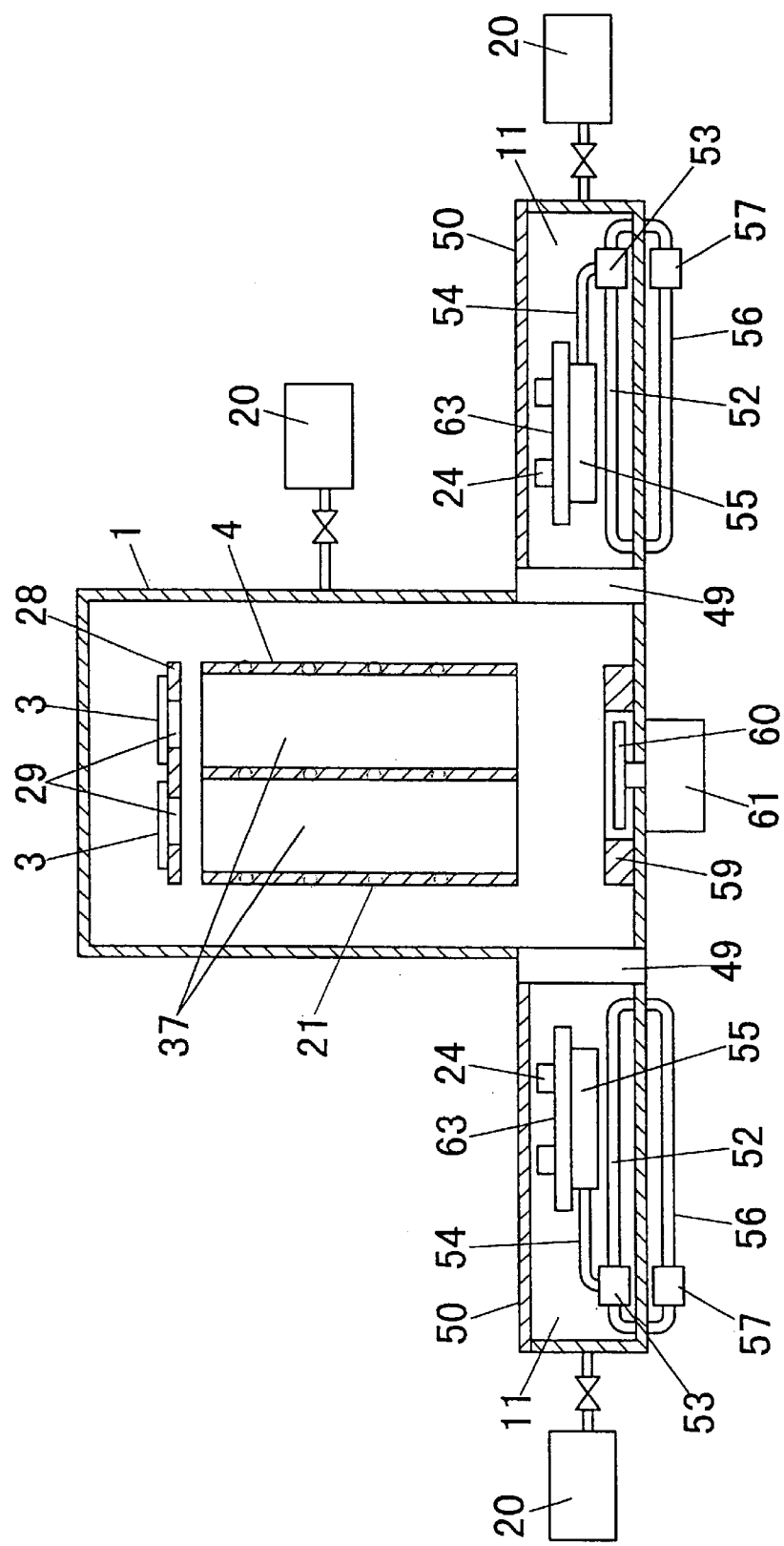
FIG. 8 is a schematic longitudinal sectional view of the vacuum vapor deposition apparatus according to a seventh embodiment of the present invention.

Sixth Embodiment (FIG. 7)

Where the substrate 3 is available in the form of a length of strip 8 such as, for example, a film strip made of synthetic resin such as PET or polyethylene, a vacuum vapor deposition apparatus shown in FIG. 7 can be effectively used therewith. The vacuum chamber 1 used in the vacuum vapor deposition apparatus in this embodiment of FIG. 7 includes a plurality of partition walls 4 cooperating with each other to define parallel chambers 37 each between the neighboring partition walls 4 that open downwardly and upwardly. Each of the partition walls 4 has a respective sheathed heater 21 secured thereto for heating the corresponding partition wall 4. The heating element 24 is disposed at a lower region of each of the partition chambers 37 and can be set in position after the vapor source 2 has been mounted on the heating element 24.

The interior of the vacuum chamber 1 is divided into upper and lower compartments by means of a partition ceiling 46 having a deposit window 47 defined therein at a location above the partition chambers 37. A pair of rolls 9 and 10 are accommodated within the upper compartment defined above the partition ceiling 46. One of the rolls, that is, the roll 9 has a roll of the elongated strip 8 wound therearound whereas the other roll 10 is used to wind up the length of the elongated strip 8 that has been drawn outwardly from the supply roll 9. A backup roll 48 is disposed between the supply and take-up rolls 9 and 10 and in alignment with the deposit window 47 with an outer portion thereof situated within the deposit window 47. The elongated strip 8 extends from the supply roll 9 to the take-up roll 10 with a generally intermediate portion thereof turned around the backup roll 48 so as to confront the vapor sources 2 through the deposit window 47.

According to the sixth embodiment shown in FIG. 7, when after the vacuum chamber 1 has been evacuated by the vacuum pump 20 the vapor sources 2 each within the lower region of the corresponding partition chamber 37 are heated by electrically energizing the associated heating elements 24 while the partition walls 4 are heated by the associated sheathed heaters 21, vapor molecules 31 are generated from the vapor source 2 within each of the partition chambers 37 inside the vacuum chamber 1. On the other hand, the elongated strip 8 is transported continuously from the supply roll 9 towards the take-up roll 10 past the backup roll 48, and as a portion of the elongated strip 8 moves along that portion of the periphery of the backup roll 48 confronting the deposit window 47, the vapor molecules 31 within the partition chambers 37 are deposited to form a deposited film on the elongated strip 8.

Since as discussed above the deposited film can be formed on the surface of the elongated strip 8 while the latter continuously travels from the supply roll 9 towards the take-up roll 10, it is possible to form the deposited film of a uniform thickness over the length of the elongated strip 8. Also, the speed at which the rolls 9 and 10 rotate is adjustably controlled and, accordingly, by changing a strip winding speed by controlling the rotational speed of the rolls 9 and 10, the speed at which the elongated strip 8 moves can be adjusted so that the thickness of the film being formed on the elongated strip 8 can be controlled, while formation of the film can be performed at a high speed.

It is to be noted that in any one of the foregoing embodiments, the substrate or substrates 3 have been described as being moved relative to the vapor sources 2. However, movement of the vapor sources 2 relative to the substrate or substrates 3 can be equally employed. Alternatively, the substrate 2 may be held in a fixed position whereas the vapor sources 2 may be moved relative to the substrate, or both of the substrate 3 and the vapor source 2 may be supported for movement.

Where the vapor source 2 is fixed in position and the hot wall 4 is also fixed in position, the position of the vapor source 2 relative to the hot wall 4 is fixed and, accordingly, there is a possibility that the material of the vapor source 2 has a propensity of being deposited on a localized area of the hot wall 4, and the effect of preventing deposition of the material by heating the hot wall 4 would become insufficient. In such case, if at least one of the vapor source 2 and the hot wall 4 is supported for movement relative to the other and vacuum vapor deposition is effected while one of the vapor source 2 and the hot wall 4 is moved relative to the other, localized vapor deposition of the vapor molecules 31 on the specific portion of the hot wall 4 can be avoided and, hence, the effect of preventing the deposition by heating the hot wall 4 can be enhanced.

Seventh Embodiment (FIGS. 8 to 12)

In a seventh embodiment shown in FIGS. 8 to 12, the vacuum chamber 1 includes a plurality of (for example, two) auxiliary chambers 11 positioned adjacent a bottom of the vacuum chamber 1 and connected with the interior of the vacuum chamber 1 through respective gate valves 49 each capable of being selectively opened and closed. Each of the auxiliary chambers 11 can be connected with the interior of the vacuum chamber 1 when the respective gate valve 49 is opened, but can be isolated airtight when the respective gate valve 49 is closed. While as hereinabove described the vacuum chamber 1 is fluid-connected with the vacuum pump 20, the auxiliary chambers 11 have their own vacuum pumps 20 fluid-connected respectively therewith. Each of the auxiliary chambers 11 has a top lid 50 for selectively opening and closing the top opening of the respective auxiliary chamber 11.

A plurality of walls 4 each in the form of a partition wall are disposed within an upper region of the vacuum chamber 1, with the neighboring walls 4 defining the partition chamber 37 that opens upwardly and downwardly within the vacuum chamber 1. The walls 4 can be heated by respective sheathed heaters 21 secured thereto. A substrate support 28 is disposed within the vacuum chamber 1 and immediately above the top openings of the partition chambers 37 and has a plurality of (for example, two) deposit windows 29 defined therein so that substrates 3 placed on the substrate support 28 can be exposed downwardly through the associated deposit windows 29 so as to confront the respective vapor source 2 as will be described later.

Within each of the auxiliary chambers 11, a generally linear guide rail 52 is disposed with a driven slide piece 53 slidably mounted on the guide rail 52 for movement in a direction close towards and away from the vacuum chamber 1. A carrier arm 54 is mounted on the driven slide piece 53 so as to extend upwardly a slight distance and be bent to protrude in a direction parallel to the guide rail 52 and towards the vacuum chamber 1. A movable stage 55 having a vapor source holding cassette 63 mounted thereon is fixedly mounted on a free end of the carrier arm 54. The movable stage 55 within each of the auxiliary chambers 11 represents a generally U-shaped configuration opening towards the vacuum chamber 1, as clearly shown in FIG. 10.

A drive guide rail 56 similar in shape to the guide rail 52 and having a drive slide piece 57 slidably mounted thereon is positioned externally of and secured to a bottom wall of the respective auxiliary chamber 11 so as to extend parallel to the guide rail 52. The driven and drive slide pieces 53 and 57 are employed in the form of magnets so that when the drive slide piece 57 is moved along the guide rail 56, the driven slide piece 53 can be synchronously moved along the guide rail 52 by the effect of magnetic attraction developed between these slide pieces 53 and 57.

Figure 11:
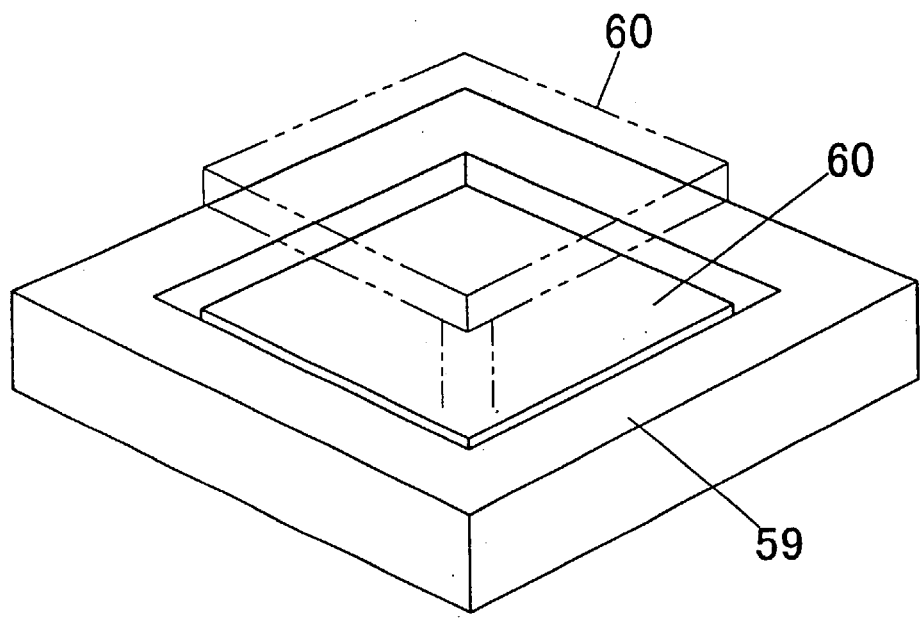
FIG. 11 is a schematic perspective view, on an enlarged scale, depicting a different portion of the vacuum vapor deposition apparatus shown in FIG. 8.
Figure 12:
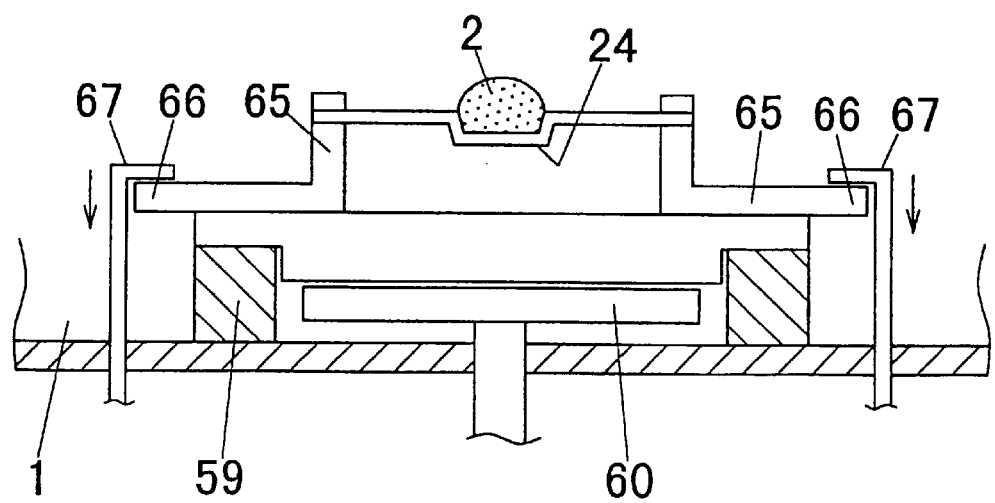
FIG. 12 is a schematic sectional view of that portion of the vacuum vapor deposition apparatus shown in FIG. 10.

A stationary stage 59 is fixedly mounted on the bottom of the vacuum chamber 1. The stationary stage 59 is of a generally rectangular or square configuration having a center opening defined therein, as best shown in FIG. 11, and a lift table 60 is positioned within the center opening of the stationary stage 59. The lift table 60 is in turn drivingly connected with a cylinder device 61 so that the lift table 60 can be selectively elevated to a position above the center opening of the stationary table 59, as shown by a phantom line in FIG. 11, and lowered to a position within the center opening of the stationary table 59 as shown by a solid line in FIG. 11.

Figure 10:
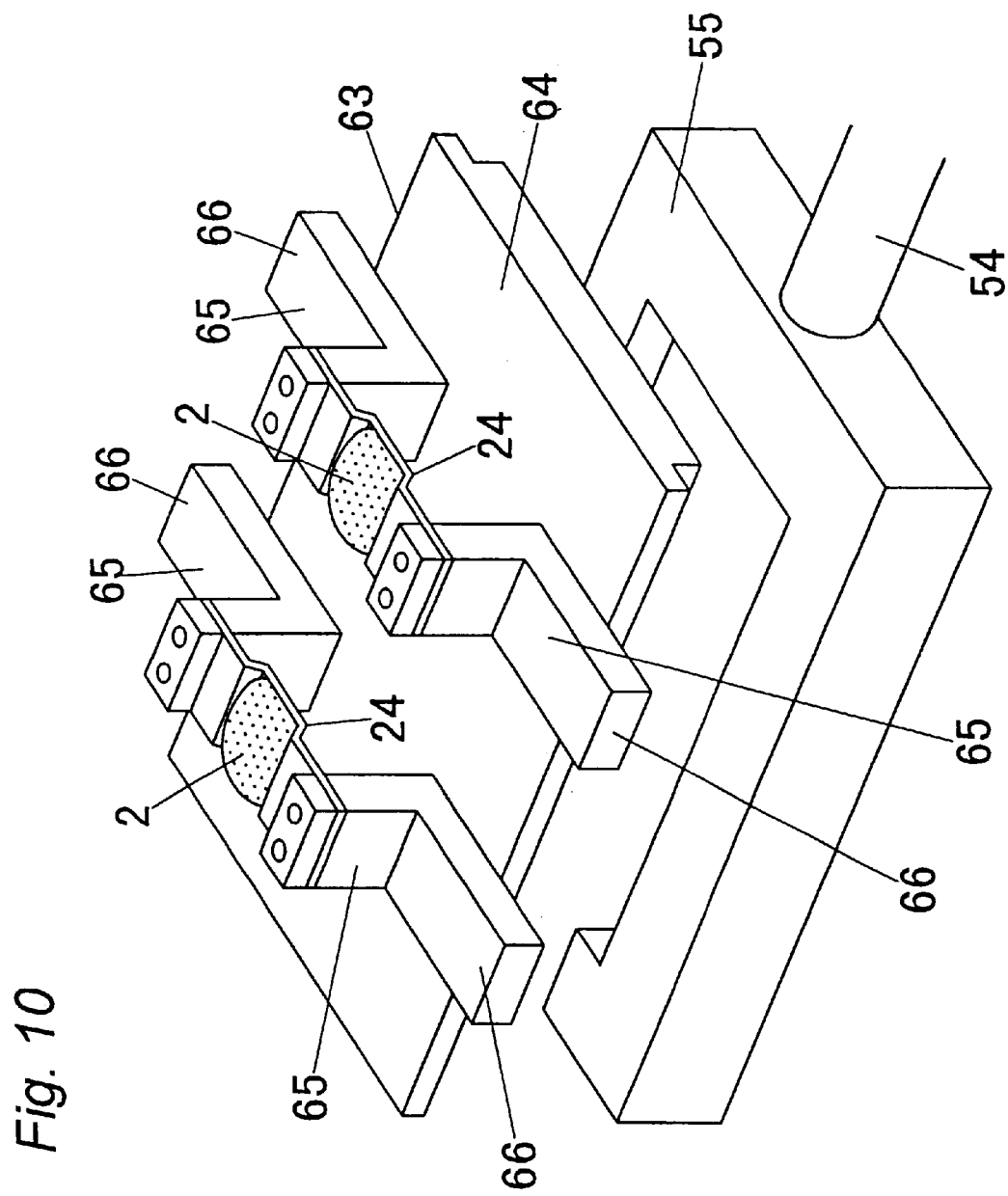
FIG. 10 is a schematic perspective view, on an enlarged scale, depicting another portion of the vacuum vapor deposition apparatus shown in FIG. 8.

FIG. 10 illustrates the details of the vapor source holding cassette 63. As shown therein, the vapor source holding cassette 63 includes a carrier plate 64 having a plurality of (for example, two) pairs of generally L-shaped terminal members 65 fixedly mounted thereon. A heating element 24 in the form of a boat made of a metal having a high melting point is mounted on each pair of the terminal members 65 so as to straddle between the terminal members 65 of the respective pair. The pairs of the terminal members 65 have respective connecting ends 66 that protrude outwardly from the perimeter of the carrier plate 64 for electric connection with the power source (shown by 26 in FIG. 1) through corresponding power supply electrode members 67 as will be described later. This vapor source holding cassette 63 within each of the auxiliary chambers 11 is used as mounted on the associated movable stage 55.

Figure 9A:
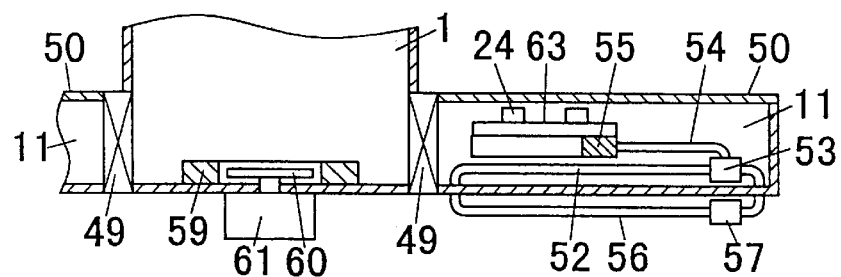
FIGS. 9A, 9B, 9C, 9D and 9E are schematic longitudinal sectional views of a portion of the vacuum vapor deposition apparatus shown in FIG. 8, depicting the sequence of operation thereof.
Figure 9B:
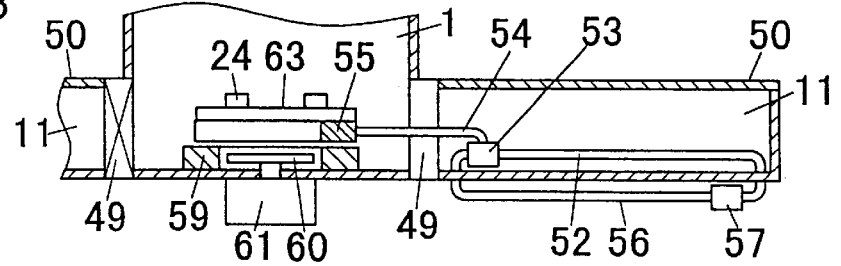

The vacuum vapor deposition apparatus according to the seventh embodiment of the present invention operated in the following manner to accomplish the vacuum vapor deposition to form the film on the substrate. At the outset, the top lid 50 of one of the auxiliary chamber 11 is opened so that vapor sources 2 can be placed on the associated heating elements 24 on the vapor source holding cassette 63 then positioned within such auxiliary chamber 11. After the top lid 50 has been closed as shown in FIG. 9A, the vacuum pump 20 is driven to evacuate the auxiliary chamber 11 to a substantial vacuum condition. On the other hand, the vacuum chamber 1 is kept evacuated and the walls 4 are also kept heated. Thereafter, the associated gate valve 49 is opened to establish communication between the vacuum chamber 1 and such one of the auxiliary chambers 11, and when the drive slide piece 57 associated with such one of the auxiliary chambers 11 is slid along the guide rail 56 towards the vacuum chamber 1, the driven slide piece 53 then magnetically coupled with the drive slide piece 57 is correspondingly slid along the guide rail 52 towards the vacuum chamber 1, with the movable stage 55 consequently introduced into the vacuum chamber 1 through the opened gate valve 40 to thereby assume a position immediately above the stationary stage 59 as shown in FIG. 9B.

Figure 9C:
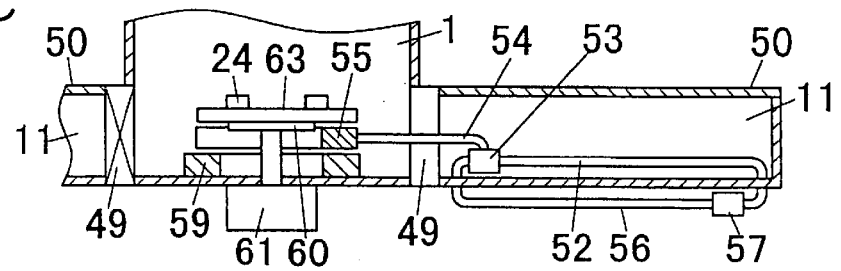

As a matter of course, the vapor source holding cassette 63 placed on the movable stage 55 is also introduced into the vacuum chamber 1 together with the movable stage 55 to the position immediately above the stationary stage 59. Thereafter, the lift table 60 is elevated upwardly through the center opening of the stationary stage 59 with the vapor source holding cassette 63 consequently lifted from the movable stage 55 as shown in FIG. 9C. As the vapor source holding cassette 63 is lifted in this way, the drive slide piece 57 is slid along the guide rail 56 towards the associated auxiliary chamber 11, accompanied by a corresponding slide of the driven slide piece 53 along the guide rail 52, with the movable stage 55 consequently returned from the vacuum chamber 1 to the associated auxiliary chamber 11 as shown in FIG. 9D.

Figure 9D:
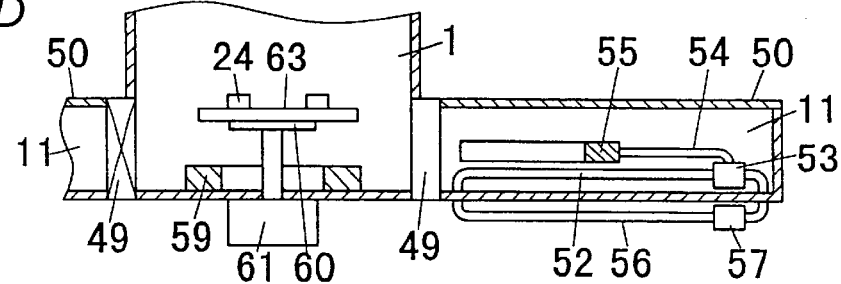
Figure 9E:
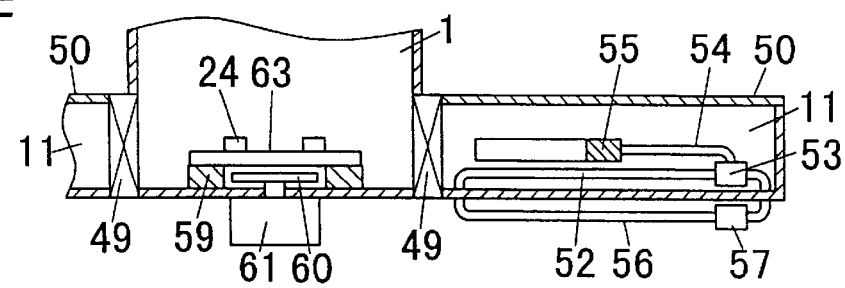

Subsequent to the condition shown in FIG. 9D, the lift table 60 is lowered to allow the vapor source holding cassette 63 to be placed on the stationary stage 59 as shown in FIG. 9E. After placement of the vapor source holding cassette 63 on the stationary stage 59 as shown in FIG. 9E, the power supply electrode members 67, operatively accommodated within the vacuum chamber 1, are lowered to thereby connect the connecting ends 66 of the paired terminal members 65 on the vapor source holding cassette 63 with the electric power source to heat the heating elements 24.

Simultaneously with or shortly after energization f the heating elements 24, the gate valve 49 is closed to isolate the vacuum chamber 1 from the associated auxiliary chamber 11. In this condition, vacuum vapor deposition is effected to deposit the materials of the vapor sources 2 placed on the heating elements 24 on the substrates 3 to thereby form the film on the substrates 3 in a manner similar to that described previously.

After the vapor sources 2 have been consumed, the vapor source holding cassette 63 is returned to the associated auxiliary chamber 11 in a manner substantially reverse to that described above. More specifically, after the vapor sources 2 have been consumed, the lift table 60 is elevated to lift the holding cassette 63, followed by opening of the gate valve 49 to allow the movable stage 55 to be introduced into the vacuum chamber 1. The lift table 60 is then lowered to place the vapor source holding cassette 63 onto the movable stage 55, followed by return of the vapor source holding cassette 63 to the associated auxiliary chamber 11 together with the movable stage 55. Finally, the gate valve 49 is closed.

After the vapor sources 2 within one of the auxiliary chambers 11 have been utilized in the manner described above, the vapor sources 2 within the other of the auxiliary chambers 11 may be utilized in a manner similar to that described hereinabove.

With the vacuum vapor deposition apparatus of the structure described above, the vacuum chamber 1 need not be open to the atmosphere and replacement of the vapor sources 2 within the vacuum chamber 1 can be quickly performed and, accordingly, it is possible to vapor deposit on the substrate 3 a film of an increased film thickness.

Although in describing the embodiment shown in FIGS. 8 to 12 reference has been made to the use of one pair of the auxiliary chambers 11, the number of the auxiliary chambers 11 may not be always limited to two such as shown, but may be one or more than two. Where three or more auxiliary chambers 11 are employed, it is preferred that these auxiliary chambers 11 be arranged so as to extend radially outwardly from the bottom of the vacuum chamber 1 generally in a spider pattern when viewed from top of the vacuum chamber 1.

Figure 13A:
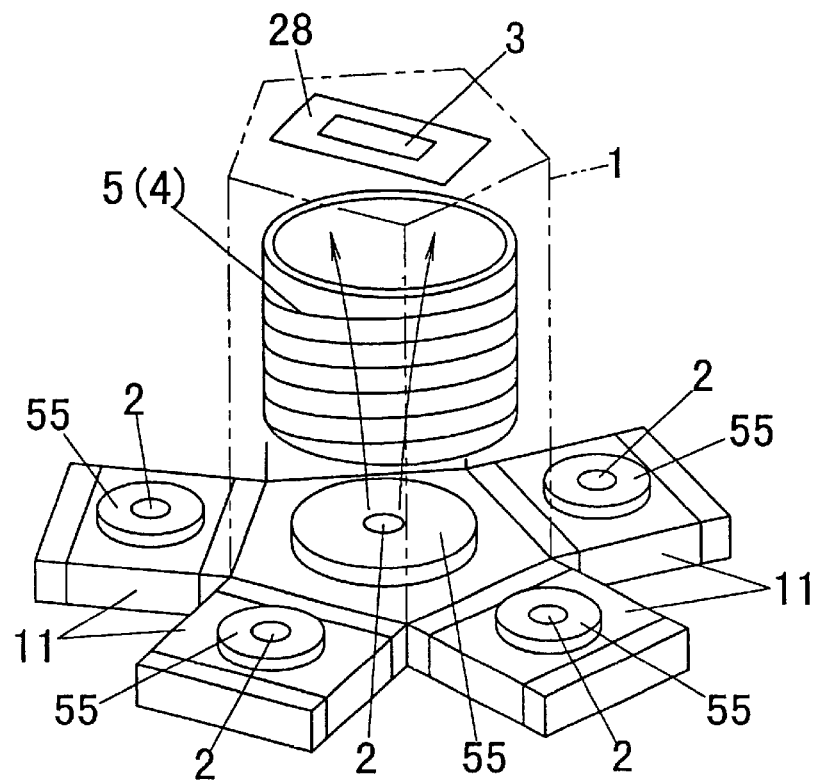
FIG. 13A is a schematic perspective view depicting a modification of the vacuum vapor deposition apparatus to the seventh embodiment of the present invention.
Figure 13B:
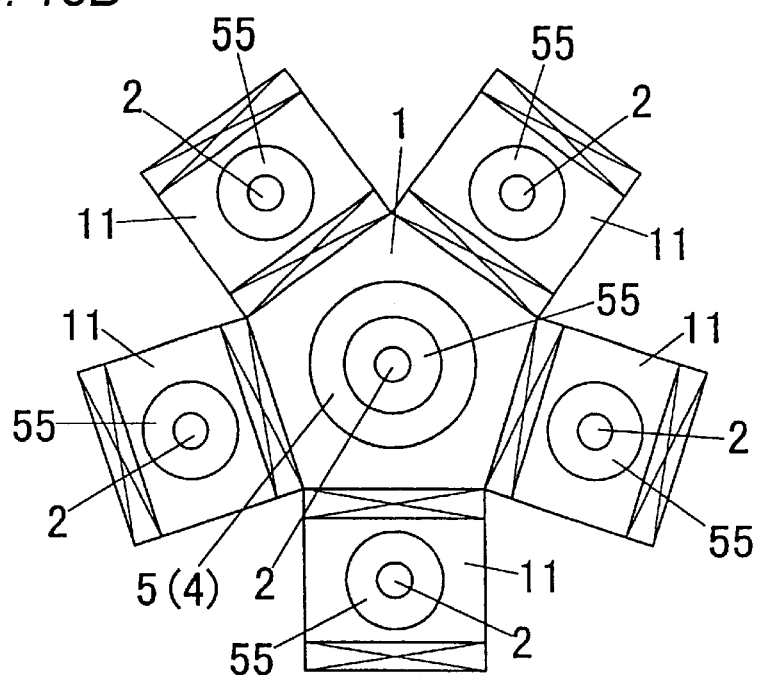
FIG. 13B is a schematic top plan view of the modified vacuum vapor deposition apparatus shown in FIG. 13A.
Figure 14:
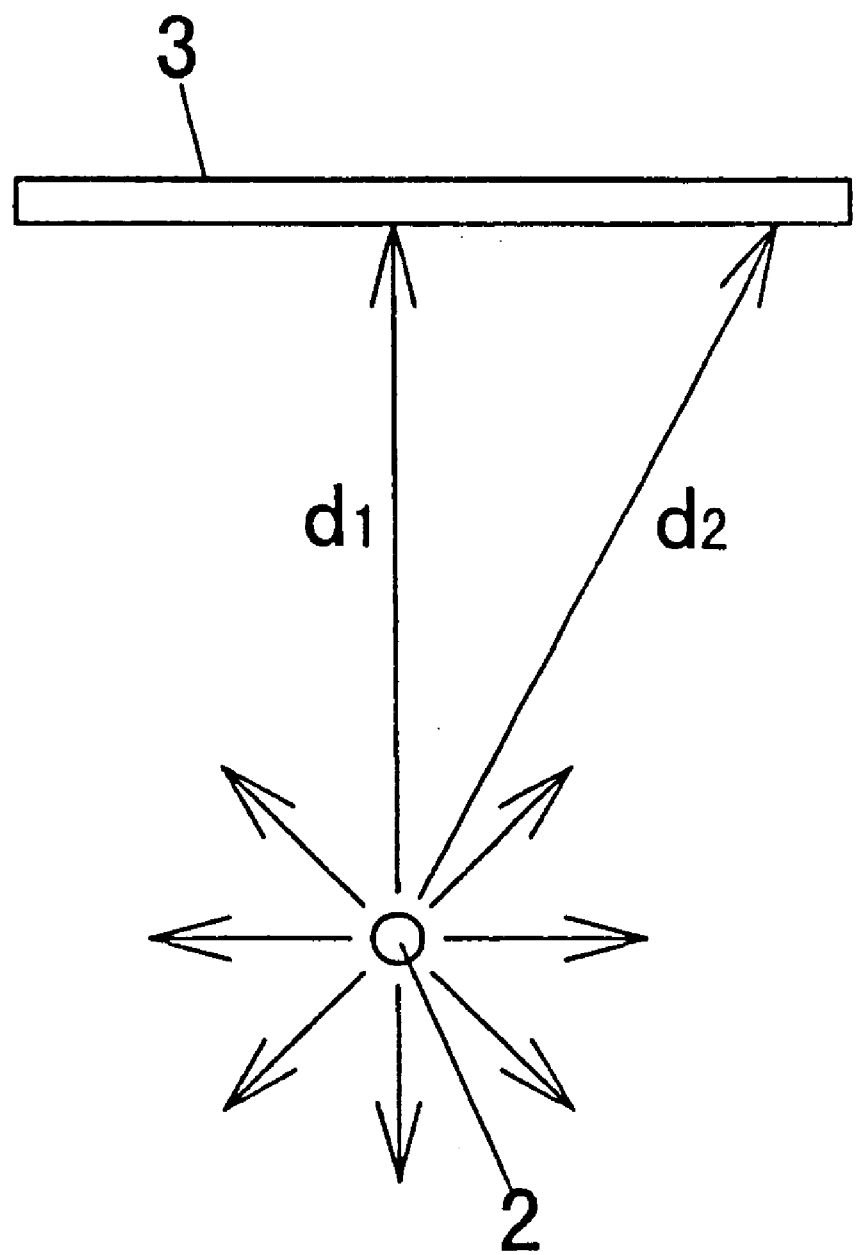
FIG. 14 is a schematic diagram depicting the manner in which vapor molecules travel from a vapor source towards a substrate.

Modification (FIGS. 13A and 13B)

FIGS. 13A and 13B illustrate the vacuum vapor deposition apparatus of the structure shown in FIGS. 8 to 12, which is modified in accordance with the present invention to include five auxiliary chambers 11. The vacuum chamber 1 shown therein has a pentagonal section having five sides along which the five auxiliary chambers 11 are disposed so as to extend radially outwardly therefrom as best shown in FIG. 13B. It is to be noted that, for the sake of brevity, each of the five auxiliary chambers 11 is shown as accommodating therein a single vapor source 2. When in use, the vapor source 2 within the vacuum chamber 1 may be replaced with one of the vapor sources 2 within the auxiliary chambers 11 in succession. Alternatively, the vapor sources 2 within the respective auxiliary chambers 11 may contain different materials, respectively, so that the different vapor sources 2 can be successively loaded into the vacuum chamber 1 one at a time.

It is to be noted that when the chamber in which the vapor source 2 and the substrate 3 confront each other is enclosed by the hot wall 4, this chamber may not be completely enclosed by the hot wall 4, but 60 to 90% of the chamber may be enclosed by the hot wall 4. By so doing, it is possible to form the film of a uniform thickness by means of the vacuum vapor deposition at a high yield.

Also, the hot wall 4 which is heated to a temperature effective to avoid deposition of the organic material is preferably of a structure in which the surface of the hot wall 4 surrounding the chamber in which the vapor source 2 and the substrate 3 confront each other is made of a material that hardly reacts with the organic material. Examples of the material include a ceramic material such as, for example, alumina or silicon carbide, diamond or stainless steel. If the hot wall 4 is made of such material, any possible transformation of the organic material which would otherwise occur when deposited on the hot wall 4 can be avoided, and even when the organic material once deposited on the hot wall 4 is re-vaporized upon heating to deposit on the substrate to thereby form a film, any possible reduction in purity of the resultant film can be avoided.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A vacuum vapor deposition apparatus comprising:
    a vacuum chamber having a plurality of vapor sources and a heater configured to heat the plurality of vapor sources to achieve vacuum vapor deposition on a surface of at least one substrate within the vacuum chamber;
    at least one vapor source of the plurality of vapor sources configured to hold an organic material;
    a hot wall heated to a temperature at which the organic material is neither deposited nor decomposed, said hot wall enclosing a space in which the plurality of vapor sources and the substrate confront each other; and
    said organic material being vapor deposited on the surface of the substrate by heating the at least one vapor source of the plurality of vapor sources while the plurality of vapor sources and the substrate are moved relative to each other.

2. The vacuum vapor deposition apparatus as claimed in claim 1, wherein while the plurality of vapor sources and the hot wall are moved relative to each other, vapor deposition is effected on the surface of the substrate by heating the plurality of vapor sources.

3. The vacuum vapor deposition apparatus as claimed in claim 1, further comprising a substrate transport device configured to move the substrate relative to the plurality of vapor sources, said substrate transport device being capable of controlling a speed of movement of the substrate.

4. The vacuum vapor deposition apparatus as claimed in claim 1, further comprising a substrate transport device configured to move the substrate relative to the plurality of vapor sources, said substrate transport device being capable of causing the substrate to move along a circular path.

5. The vacuum vapor deposition apparatus as claimed in claim 1, further comprising a supply roll and a take-up roll, and wherein the substrate comprises a length of strip that is transported from the supply roll towards the take-up roll.

6. The vacuum vapor deposition apparatus as claimed in claim 1, further comprising at least one auxiliary chamber fluid-connected with the vacuum chamber and capable of being evacuated, and wherein one of the plurality of vapor sources is selectively loaded or unloaded between the vacuum chamber and the auxiliary chamber.

7. The vacuum vapor deposition apparatus as claimed in claim 1, wherein a top opening of the hot wall adjacent the substrate has a width as measured in a direction perpendicular to a direction of movement of the substrate, which is within a range from a value 20% greater than a width of the substrate as measured in the direction perpendicular to the direction of movement of the substrate, to a value 20% smaller than the width of the substrate.

8. The vacuum vapor deposition apparatus as claimed in claim 1, wherein the hot wall encloses 60 to 90% of the space in which the plurality of vapor sources and the substrate confront each other.

9. The vacuum vapor deposition apparatus as claimed in claim 1, wherein a surface of the hot wall confronting the space in which the plurality of vapor sources and the substrate confront each other is made of a material hard to react with the organic material.

10. A method of vacuum vapor depositing a plurality of materials on a surface of at least one substrate by heating a plurality of vapor sources within a vacuum chamber, comprising:
    using an organic material for at least one vapor source of the plurality of vapor sources;
    heating a hot wall to a temperature at which the organic material is neither deposited nor decomposed;
    heating the plurality of vapor sources while the plurality of vapor sources and the substrate, which confront each other, are enclosed by the hot wall; and
    moving the substrate and the plurality of vapor sources relative to each other during said heating of the plurality of vapor sources.

11. The method as claimed in claim 10, wherein the organic material used in said at least one vapor source of said plurality of vapor sources is an organic electroluminescent material.

12. An organic electroluminescent device formed by depositing a plurality of organic electroluminescent materials on a surface of a substrate by the method as defined in claim 11.

13. A vacuum vapor deposition apparatus comprising:
    a vacuum chamber having a plurality of vapor sources and a heater configured to heat the plurality of vapor sources to achieve vacuum vapor deposition on a surface of at least one substrate within the vacuum chamber;
    at least one vapor source of the plurality of vapor sources configured to hold an organic material; and
    a hot wall heated to a temperature at which the organic material is neither deposited nor decomposed, said hot wall enclosing a space in which the plurality of vapor sources and the substrate confront each other, wherein
    said organic material being vapor deposited on the surface of the substrate by heating the plurality of vapor sources, and
    a length of a horizontal projection of said at least one vapor source of said plurality of vapor sources is smaller than a length of a horizontal projection of said hot wall to promote a wide scattering of molecules of said organic material on said hot wall, and said scattered molecules of said organic material are reflected by said hot wall towards said substrate to achieve a uniform vapor deposition on said substrate.

14. The vacuum vapor deposition apparatus as claimed in claim 13, wherein while the plurality of vapor sources and the hot wall are moved relative to each other, vapor deposition is effected on the surface of the substrate by heating the plurality of vapor sources.

15. The vacuum vapor deposition apparatus as claimed in claim 13, further comprising a substrate transport device configured to move the substrate relative to the plurality of vapor sources, said substrate transport device being capable of controlling a speed of movement of the substrate.

16. The vacuum vapor deposition apparatus as claimed in claim 13, further comprising a substrate transport device configured to move the substrate relative to the plurality of vapor sources, said substrate transport device being capable of causing the substrate to move along a circular path.

17. The vacuum vapor deposition apparatus as claimed in claim 13, further comprising a supply roll and a take-up roll, and wherein the substrate comprises a length of strip that is transported from the supply roll towards the take-up roll.

18. The vacuum vapor deposition apparatus as claimed in claim 13, further comprising at least one auxiliary chamber fluid-connected with the vacuum chamber and capable of being evacuated, and wherein one of the plurality of vapor sources is selectively loaded or unloaded between the vacuum chamber and the auxiliary chamber.

19. The vacuum vapor deposition apparatus as claimed in claim 13, wherein a top opening of the hot wall adjacent the substrate has a width as measured in a direction perpendicular to a direction of movement of the substrate, which is within a range from a value 20% greater than a width of the substrate as measured in the direction perpendicular to the direction of movement of the substrate, to a value 20% smaller than the width of the substrate.

20. The vacuum vapor deposition apparatus as claimed in claim 13, wherein the hot wall encloses 60 to 90% of the space in which the plurality of vapor sources and the substrate confront each other.

21. The vacuum vapor deposition apparatus as claimed in claim 13, wherein a surface of the hot wall confronting the space in which the plurality of vapor sources and the substrate confront each other is made of a material hard to react with the organic material.

22. A method of vacuum vapor depositing a plurality of materials on a surface of at least one substrate by heating a plurality of vapor sources within a vacuum chamber, comprising:

using an organic material for at least one vapor source of the plurality of vapor sources;

heating a hot wall to a temperature at which the organic material is neither deposited nor decomposed; and heating the plurality of vapor sources while the plurality of vapor sources and the substrate, which confront each other, are enclosed by the hot wall, wherein a length of a horizontal projection of said at least one vapor source of said plurality of vapor sources is smaller than a length of a horizontal projection of said hot wall to promote a wide scattering of molecules of said organic material on said hot wall, and said scattered molecules of said organic material are reflected by said hot wall towards said substrate to achieve a uniform vapor deposition on said substrate.

23. The method as claimed in claim 22, wherein the organic material used in said at least one vapor source of said plurality of vapor sources is an organic electroluminescent material.

24. An organic electroluminescent device formed by depositing a plurality of organic electroluminescent materials on a surface of a substrate by the method as defined in claim 23.

* * * * *